(12) United States Patent
Kato et al.

(10) Patent No.: US 8,840,727 B2
(45) Date of Patent: *Sep. 23, 2014

(54) FILM DEPOSITION APPARATUS, SUBSTRATE PROCESSOR, FILM DEPOSITION METHOD, AND COMPUTER-READABLE STORAGE MEDIUM

(75) Inventors: Hitoshi Kato, Oshu (JP); Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1244 days.

This patent is subject to a terminal disclaimer.

(21) Appl. No.: 12/550,528

(22) Filed: Aug. 31, 2009

(65) Prior Publication Data

US 2010/0055319 A1   Mar. 4, 2010

(30) Foreign Application Priority Data

Sep. 4, 2008   (JP) .................................. 2008-227030

(51) Int. Cl.
C23C 16/455 (2006.01)
C23C 16/00 (2006.01)
C23C 16/52 (2006.01)
H01L 21/687 (2006.01)
H01L 21/67 (2006.01)

(52) U.S. Cl.
CPC .......... *C23C 16/52* (2013.01); *H01L 21/68771* (2013.01); *H01L 21/68764* (2013.01); *C23C 16/45544* (2013.01); *H01L 21/67109* (2013.01); *C23C 16/45565* (2013.01)
USPC .......................................... 118/719; 118/730

(58) Field of Classification Search
USPC ................................. 118/719, 730
See application file for complete search history.

(56) References Cited

U.S. PATENT DOCUMENTS

| 6,634,314 | B2 | 10/2003 | Hwang et al. | |
|---|---|---|---|---|
| 7,153,542 | B2 | 12/2006 | Nguyen et al. | |
| 8,372,202 | B2 * | 2/2013 | Kato et al. | 118/719 |
| 8,465,591 | B2 * | 6/2013 | Kato et al. | 118/719 |
| 8,465,592 | B2 * | 6/2013 | Kato et al. | 118/719 |
| 2006/0073276 | A1 * | 4/2006 | Antonissen | 427/248.1 |
| 2007/0095286 | A1 * | 5/2007 | Baek et al. | 118/719 |
| 2007/0218701 | A1 | 9/2007 | Shimizu et al. | |
| 2007/0218702 | A1 * | 9/2007 | Shimizu et al. | 438/758 |

FOREIGN PATENT DOCUMENTS

JP   04-287912   10/1992
JP   07-321045   12/1995

(Continued)

*Primary Examiner* — Karla Moore
*Assistant Examiner* — Nathan K Ford
(74) *Attorney, Agent, or Firm* — IPUSA, PLLC

(57) ABSTRACT

A film deposition apparatus for depositing a thin film on a substrate by feeding at least two kinds of reaction gases in a vacuum chamber includes a turntable; a substrate placement part on the turntable; a first and a second reaction gas feed part provided apart from each other to feed a first and a second reaction gas into a first and a second process region, respectively, on the turntable; a separation region positioned between the first and second process regions and including a first separation gas feed part to feed a first separation gas and a ceiling surface; a center part region positioned inside the vacuum chamber and including an ejection opening for ejecting a second separation gas; an evacuation port; and a drive part to rotate the turntable so that the substrate passes through the first and second process regions at different angular velocities of the turntable.

9 Claims, 22 Drawing Sheets

(56) References Cited

FOREIGN PATENT DOCUMENTS

| JP | 3144664 | 3/2001 |
| JP | 2001-254181 | 9/2001 |
| JP | 2007-247066 | 9/2007 |
| JP | 2008-509547 | 3/2008 |

* cited by examiner

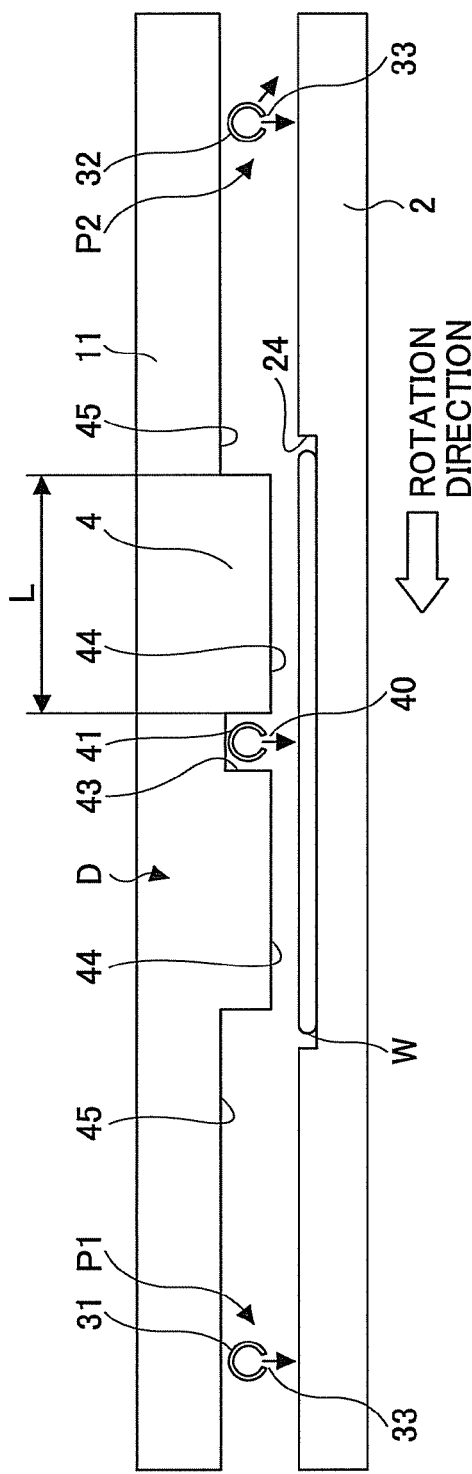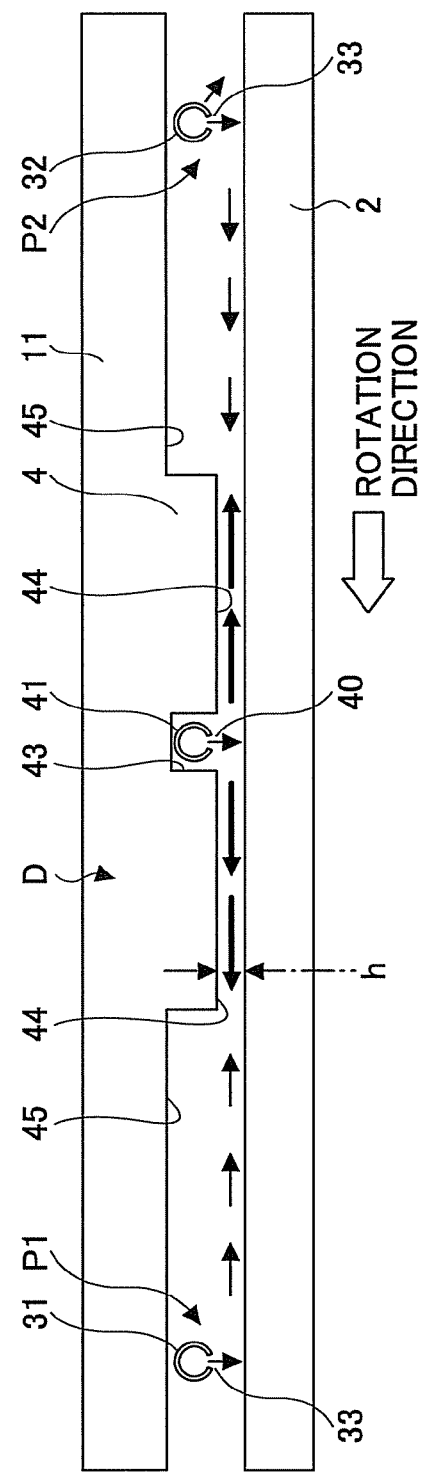
FIG.4A
FIG.4B

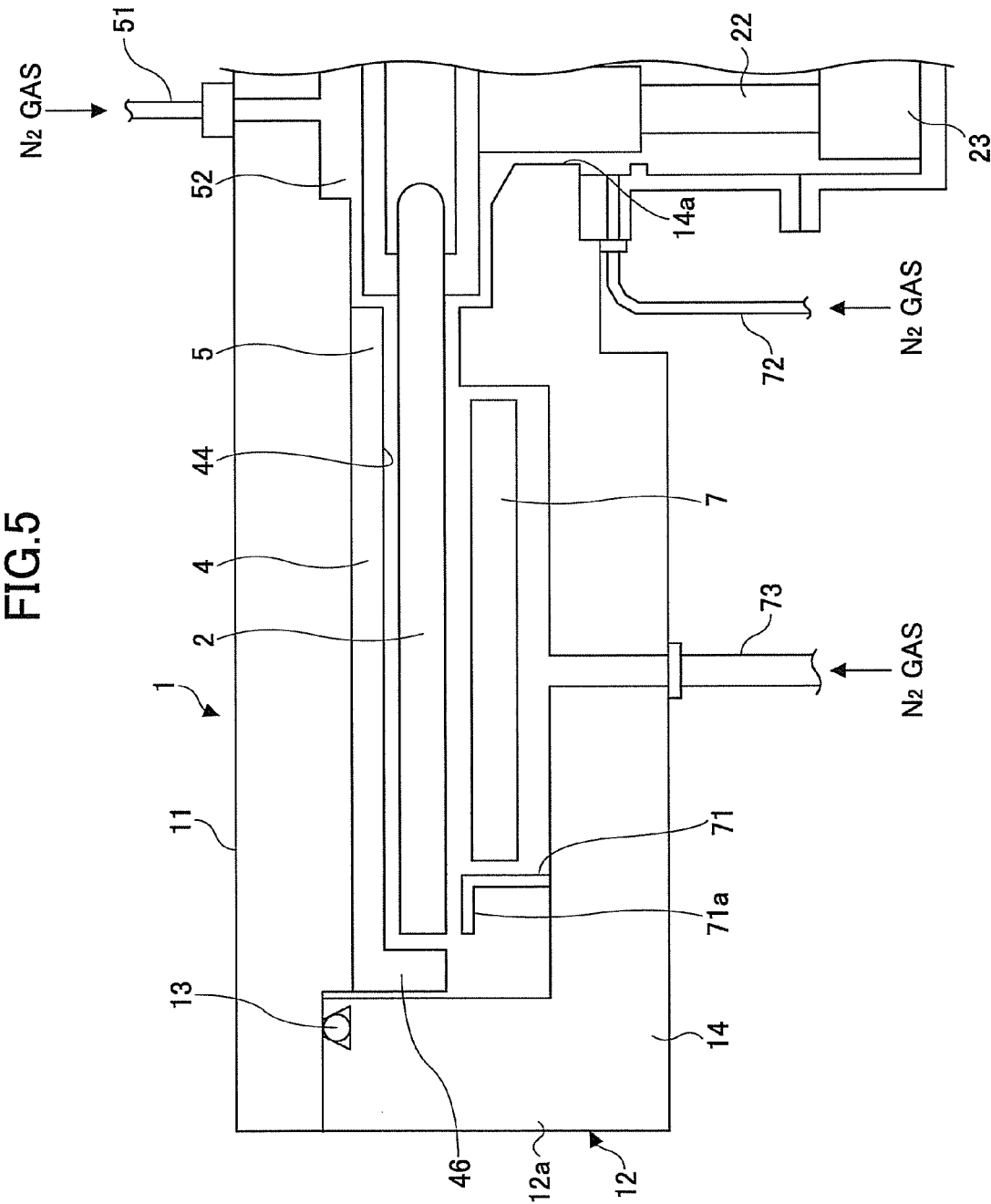

FILM DEPOSITION APPARATUS, SUBSTRATE PROCESSOR, FILM DEPOSITION METHOD, AND COMPUTER-READABLE STORAGE MEDIUM

CROSS-REFERENCE TO RELATED APPLICATION

The present application is based on and claims the benefit of priority of Japanese Patent Application No. 2008-227030, filed on Sep. 4, 2008, the entire contents of which are incorporated herein by reference.

BACKGROUND OF THE INVENTION

1. Field of the Invention

The present invention relates to a film deposition apparatus, a substrate processor, a film deposition method, and a computer-readable storage medium storing a program for causing a computer to execute the film deposition method.

2. Description of the Related Art

Processes such as those called atomic layer deposition (ALD) and molecular layer deposition (MLD) are known as film deposition techniques in the semiconductor manufacturing process. According to these processes, a first reaction gas is adsorbed on the surface of a semiconductor wafer (hereinafter referred to as "wafer"), serving as a substrate, in a vacuum atmosphere, and thereafter, the fed gas is switched to a second reaction gas, thereby forming a single or multiple atomic or molecular layers through reaction of the first and second reaction gases. This cycle is repeated one or more times, and a film is deposited on the substrate by stacking these layers. According to these processes, it is possible to control film thickness with high accuracy based on the number of cycles, and the deposited film has excellent uniformity in in-plane quality. Thus, these processes are effective techniques that can address reduction in the film thickness of semiconductor devices.

For example, such a film deposition method is suitable for depositing a high-k dielectric film used for a gate oxide film. By way of example, in the case of depositing a silicon oxide film ($SiO_2$ film), gas such as bis(tertiary-butylamino) silane (BTBAS) gas is used as a first reaction gas (source gas), and gas such as ozone gas is used as a second reaction gas (oxidation gas).

In order to carry out such a film deposition method, studies have been made of a method that employs a single-wafer film deposition apparatus having a shower head at the top center part of a vacuum chamber to feed reaction gases from above the center part of a substrate and to discharge unreacted reaction gases and reaction by-products from the bottom of the chamber. According to this film deposition method, it takes a long time for a purge gas to complete gas replacement, and the number of cycles reaches, for example, several hundred, thus resulting in the problem of a long process time. Therefore, there is a demand for apparatuses and techniques that can perform processing with high throughput.

In view of this, apparatuses that perform a film deposition process with multiple substrates arranged on a turntable in its rotation direction in a vacuum chamber have been known as follows.

Patent Document 1 listed below describes a configuration where a flat cylindrical vacuum chamber is divided into right and left semicylindrical regions having respective evacuation ports formed along semicircular outlines so as to perform evacuation in an upward direction. An ejection port for a separation gas is formed between the right and left semicylindrical regions along a diameter of the vacuum chamber. The right and left semicylindrical regions have respective feed regions for feeding source gases different from each other. A turntable inside the vacuum chamber rotates so that workpieces pass the right semicylindrical region, the dividing region, and the left semicylindrical region, and the source gases are evacuated from the corresponding evacuation ports.

Patent Document 2 listed below describes a configuration where four wafers are arranged at equal intervals on a wafer support member (turntable) along its rotation direction while first reaction gas ejection nozzles and second reaction gas ejection nozzles are disposed at equal intervals along the rotation direction so as to be opposed to the wafer support member with purge nozzles placed between them; and the wafer support member is caused to rotate horizontally. Each wafer is supported by the wafer support member, so that the surface of the wafer is positioned higher than the upper surface of the wafer support member by the thickness of the wafer. Further, Patent Document 2 also discloses that the nozzles are provided to extend in a radial direction of the wafer support member so that there is a distance of 0.1 mm or more between the wafers and the nozzles. Vacuum evacuation is performed through the space between the periphery of the wafer support member and the inner wall of a process chamber. According to this apparatus, the space below the purge nozzles serves as a so-called air curtain so as to prevent the first reaction gas and the second reaction gas from mixing.

Patent Document 3 listed below describes a configuration where a vacuum chamber is divided circumferentially into multiple process chambers by partition walls and a circular placement table rotatable through thin gaps below the lower ends of the partition walls is provided so that multiple wafers are placed on the placement table.

Patent Document 4 listed below describes the technique of partitioning a circular gas feed plate circumferentially into eight portions, arranging $AsH_3$ gas feed ports, $H_2$ gas feed ports, TMG gas feed ports, and $H_2$ gas feed ports 90 degrees apart, providing evacuation ports between these gas feed ports, and rotating a susceptor supporting wafers and opposed to the gas feed plate.

Patent Document 5 listed below describes a configuration where the region on a turntable is partitioned crisscross into four placement regions by four vertical walls so as to place wafers in the four placement regions, source gas (reaction gas) injectors and purge gas injectors are arranged alternately in a rotation direction to form a cross-shaped injector unit, and the injector unit is caused to rotate horizontally so as to position each of these injectors in the four placement regions in order while performing evacuation from the periphery of the turntable.

Further, Patent Document 6 listed below (corresponding to Patent Documents 7 an 8) describes an apparatus that causes a susceptor having wafers placed thereon to rotate and feeds source and purge gases from above the susceptor in performing atomic layer CVD that causes multiple gases to be adsorbed alternately on a target (corresponding to a wafer). Patent Document 6 discloses at paragraphs [0023] through [0025] that partition walls extend radially from the center of a chamber with gas outlet holes for feeding a reaction gas or a purge gas to a susceptor provided at the bottom of the partition walls and that a gas curtain is formed by letting out an inert gas from gas outlet holes of the partition walls. Evacuation is described at paragraph [0058]. According to this description, a source gas and a purge gas are evacuated separately through respective evacuation channels.

Patent Document 1: U.S. Pat. No. 7,153,542 (FIGS. 6A and 6B)
Patent Document 2: Japanese Laid-Open Patent Application No. 2001-254181 (FIGS. 1 and 2)
Patent Document 3: Japanese Laid-Open Patent Application No. 3,144,664 (FIGS. 1 and 2 and claim 1)
Patent Document 4: Japanese Laid-Open Patent Application No. H4-287912
Patent Document 5: U.S. Pat. No. 6,634,314
Patent Document 6: Japanese Laid-Open Patent Application No. 2007-247066 (paragraphs 0023 through 0025 and 0058, and FIGS. 12 and 18)
Patent Document 7: United States Patent Application Publication No. 2007/0218701
Patent Document 8: United States Patent Application Publication No. 2007/0218702

SUMMARY OF THE INVENTION

According to one aspect of the present invention, a film deposition apparatus for depositing a thin film on a substrate by stacking reaction products in layers by carrying out a cycle of successively feeding at least two kinds of reaction gases reacting with each other onto a surface of the substrate in a vacuum chamber includes a turntable provided in the vacuum chamber; a substrate placement part provided on a substrate-receiving surface of the turntable and configured to receive the substrate; a first reaction gas feed part and a second reaction gas feed part provided apart from each other in a rotation direction of the turntable and configured to feed a first reaction gas and a second reaction gas into a first process region and a second process region, respectively, on a side of the substrate-receiving surface of the turntable; a separation region positioned between the first process region and the second process region in the rotation direction of the turntable and configured to separate atmospheres of the first and second process regions, the separation region including a first separation gas feed part configured to feed a first separation gas thereinto, and a ceiling surface provided on each of sides of the first separation gas feed part in the rotation direction of the turntable and configured to form a narrow space in which the first separation gas flows from the separation region to the first and second process regions between the ceiling surface and the turntable; a center part region positioned at a center part inside the vacuum chamber and configured to separate the atmospheres of the first and second process regions, the center part region including an ejection opening for ejecting a second separation gas toward the substrate-receiving surface of the turntable; an evacuation port configured to evacuate the first separation gas diffused to each side of the separation region, the second separation gas ejected from the center part region, and the first and second reaction gases; and a drive part configured to rotate the turntable so that the substrate passes through the first and second process regions at different angular velocities of the turntable.

According to one aspect of the present invention, a film deposition apparatus for depositing a thin film on a substrate by stacking reaction products in layers by carrying out a cycle of successively feeding at least two kinds of reaction gases reacting with each other onto a surface of the substrate in a vacuum chamber includes a turntable provided in the vacuum chamber; a substrate placement part provided on a substrate-receiving surface of the turntable and configured to receive the substrate; a first reaction gas feed part and a second reaction gas feed part provided apart from each other in a rotation direction of the turntable and configured to feed a first reaction gas and a second reaction gas into a first process region and a second process region, respectively, on a side of the substrate-receiving surface of the turntable; a separation region positioned between the first process region and the second process region in the rotation direction of the turntable and configured to separate atmospheres of the first and second process regions, the separation region including a first separation gas feed part configured to feed a first separation gas thereinto, and a ceiling surface provided on each of sides of the first separation gas feed part in the rotation direction of the turntable and configured to form a narrow space in which the first separation gas flows from the separation region to the first and second process regions between the ceiling surface and the turntable; a center part region positioned at a center part inside the vacuum chamber and configured to separate the atmospheres of the first and second process regions, the center part region including an ejection opening for ejecting a second separation gas toward the substrate-receiving surface of the turntable; an evacuation port configured to evacuate the first separation gas diffused to each side of the separation region, the second separation gas ejected from the center part region, and the first and second reaction gases; a drive part configured to rotate the turntable; and a control part configured to control the first and second reaction gas feed parts and the drive part so as to stop feeding the second reaction gas in the second reaction gas feed part at a time of feeding the first reaction gas through the first reaction gas feed part, stop feeding the first reaction gas in the first reaction gas feed part at a time of feeding the second reaction gas through the second reaction gas feed part, and rotate the turntable at different angular velocities at the time of feeding the first reaction gas through the first reaction gas feed part and at the time of feeding the second reaction gas through the second reaction gas feed part.

According to one aspect of the present invention, a method of depositing a thin film by stacking reaction products in layers by carrying out a cycle of successively feeding at least two kinds of reaction gases reacting with each other onto a surface of a substrate a plurality of times includes placing the substrate on a turntable in a vacuum chamber; feeding a first reaction gas and a second reaction gas into a first process region and a second process region, respectively, on a side of a surface of the turntable on which the substrate is placed while feeding a separation gas into a separation region separating the first and second process regions; and rotating the turntable so that the substrate passes through the first and second process regions at different angular velocities of the turntable.

According to one aspect of the present invention, a method of depositing a thin film by stacking reaction products in layers by carrying out a cycle of successively feeding at least two kinds of reaction gases reacting with each other onto a surface of a substrate a plurality of times includes placing the substrate on a turntable in a vacuum chamber; rotating the turntable at a first rotational speed; feeding a first reaction gas into a first process region on a side of a surface of the turntable on which the substrate is placed while feeding a separation gas into a separation region separating the first process region and a second process region; stopping feeding the first reaction gas; rotating the turntable at a second rotational speed different from the first rotational speed; feeding a second reaction gas into the second process region on the side of the surface of the turntable on which the substrate is placed while feeding the separation gas into the separation region; and stopping feeding the second reaction gas.

BRIEF DESCRIPTION OF THE DRAWINGS

Other objects, features and advantages of the present invention will become more apparent from the following detailed description when read in conjunction with the accompanying drawings, in which:

FIGS. 4A and 4B are cross-sectional views of the film deposition apparatus, illustrating process regions and a separation region, according to the first embodiment of the present invention;

FIG. 5 is a sectional view of part of the film deposition apparatus according to the first embodiment of the present invention;

DETAILED DESCRIPTION OF THE PREFERRED EMBODIMENTS

Figure 1:
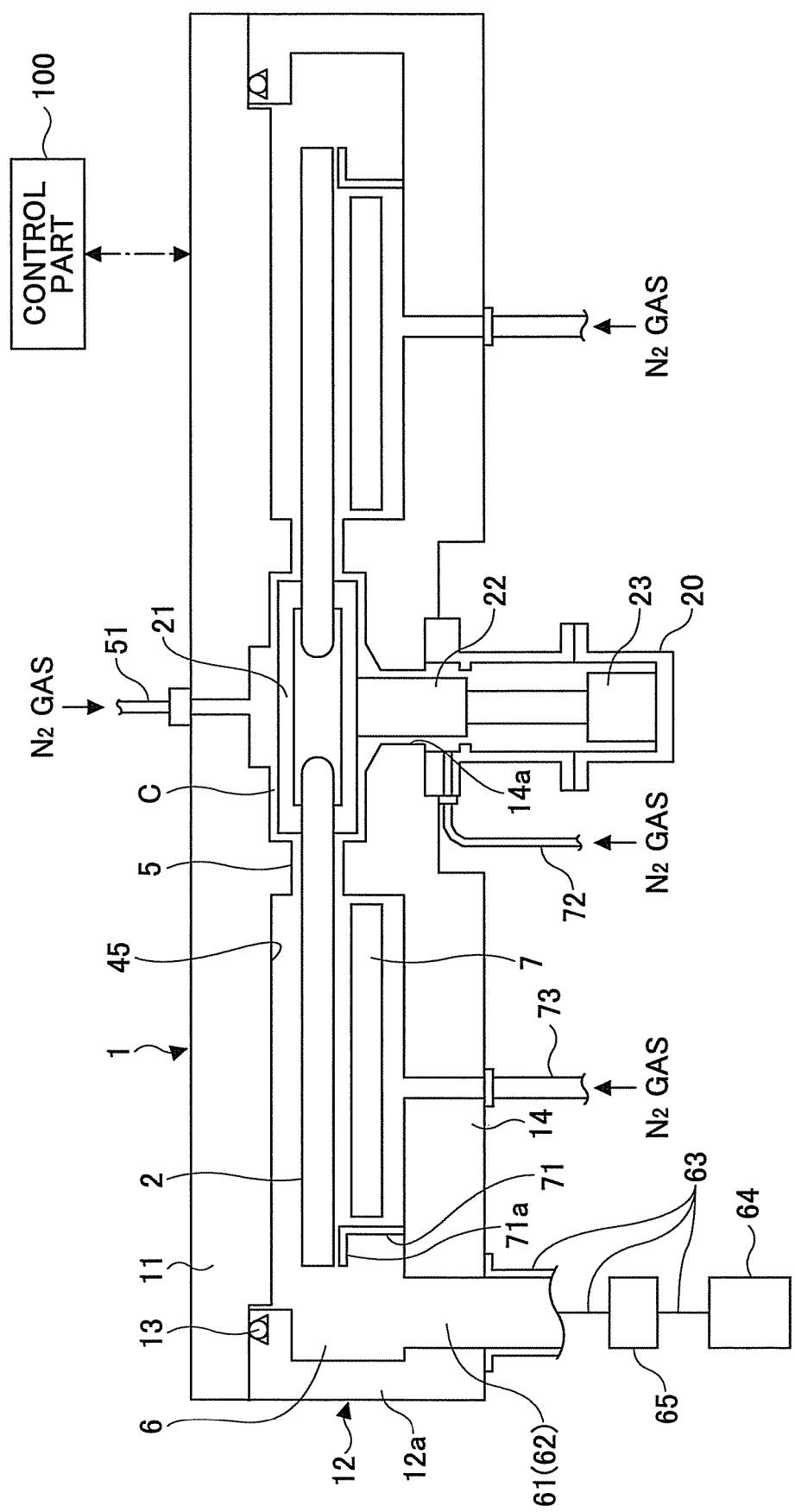
FIG. 1 is a cross-sectional view of a film deposition apparatus according to a first embodiment of the present invention.

The apparatus described in Patent Document 1 has the upward oriented evacuation ports provided between the ejection port of the separation gas and the feed regions of the reaction gases, and employs the technique of evacuating the reaction gases together with the separation gas through these evacuation ports. Therefore, the apparatus has a drawback in that wafers (workpieces) are likely to be contaminated by the particles blown upward by an upward flow of the reaction gases suctioned through the evacuation ports after being ejected onto the wafers.

According to the technique described in Patent Document 2, partially because the wafer support member is rotating, the air curtain from the purge gas nozzles alone does not prevent the reaction gases on both sides from passing through the air curtain, so that in particular, diffusion of the reaction gases from the upstream side in the rotation direction through the air curtain is unavoidable. Further, the reaction gas ejected from the first reaction gas ejection nozzle easily reaches the diffusion region of the other reaction gas ejected from the second reaction gas ejection nozzle through the center part of the wafer support member, which corresponds to a turntable. If the reaction gases are thus mixed on a wafer, a reaction product adheres to the surface of the wafer, thus preventing a good ALD (or MLD) process.

Further, according to the apparatus described in Patent Document 3, a process gas is diffused into an adjacent process chamber through the gap between a partition wall and the placement table or a wafer. Further, since an evacuation chamber is provided between process chambers, gases from the upstream-side and downstream-side process chambers are mixed in the evacuation chamber when a wafer passes through the evacuation chamber. Therefore, this is not applicable to a so-called ALD film deposition technique.

Further, the technique described in Patent Document 4 does not take any practical measures for separation of two reaction gases, so that the two reaction gases are mixed not only around the center of the susceptor but also in regions other than around the center through the $H_2$ gas feed port array regions in practice. Further, there is also a problem in that the evacuation ports provided on the surface opposed to the wafer passage region are likely to contaminate wafers with the particles blown upward from the surface of the susceptor.

Further, according to the configuration described in Patent Document 5, after feeding a source or reaction gas to each placement region, the atmosphere of the placement region is replaced by a purge gas with a purge gas nozzle, thus taking a lot of time. Further, it is highly likely that a source or reaction gas is diffused from one placement region to an adjacent placement region beyond a vertical wall so as to react with a source or reaction gas in the adjacent placement region.

According to the configuration described in Patent Document 6, the mixture of source gases from the source gas compartments on both sides is inevitable in a purge gas compartment, so that a reaction product is generated to contaminate a wafer with particles.

According to an aspect of the present invention, there are provided a film deposition apparatus, a substrate processor, and a film deposition method that enable deposition of a compact, high-quality film in the case of depositing a thin film by stacking layers of reaction products by successively feeding multiple reaction gases that react with each other onto the surface of a substrate, and a computer-readable storage medium storing a program for causing a computer to execute the film deposition method.

According to an aspect of the present invention, in the case of depositing a thin film by stacking layers of reaction products by successively feeding multiple reaction gases that react with each other onto the surface of a substrate, it is possible to ensure a sufficient time for the reaction of multiple reaction gases, so that it is possible to deposit a compact, high-quality thin film.

A description is given below, with reference to the accompanying drawings, of embodiments of the present invention.

First Embodiment

Referring to FIG. 1, a film deposition apparatus according to this embodiment includes a vacuum chamber 1 having a substantially flattened cylindrical shape and a turntable 2 provided inside the vacuum chamber 1. The turntable 2 has a rotation center at the center of the vacuum chamber 1. The vacuum chamber 1 includes a chamber body 12 and a ceiling plate 11 separable from the chamber body 12. The ceiling plate 11 is pressed against the chamber body 12 through a sealing member such as an O ring 13 because of a lower-pressure condition inside so as to maintain the vacuum chamber 1 in a hermetically sealed condition. The ceiling plate 11 is lifted up by a drive mechanism (not graphically illustrated) at the time of separating the ceiling plate 11 from the chamber body 12.

The turntable 2 is fixed to a cylindrically shaped core part 21 at the center of the vacuum chamber 1. The core part 21 is fixed to the upper end of a vertically extending rotating shaft 22. The rotating shaft 22 penetrates through a bottom part 14 of the chamber body 12 to be attached at its lower end to a drive part 23. The drive part 23 causes the rotating shaft 22 to rotate around a vertical axis, for example, clockwise in this embodiment. The rotating shaft 22 and the drive part 23 are housed in a cylindrical case body 20 that is open at its upper end. The case body 20 is hermetically attached to the bottom surface of the bottom part 14 through a flange part provided at its upper end, so that the internal atmosphere of the case body 20 is kept hermetically sealed from the external atmosphere.

Figure 2:
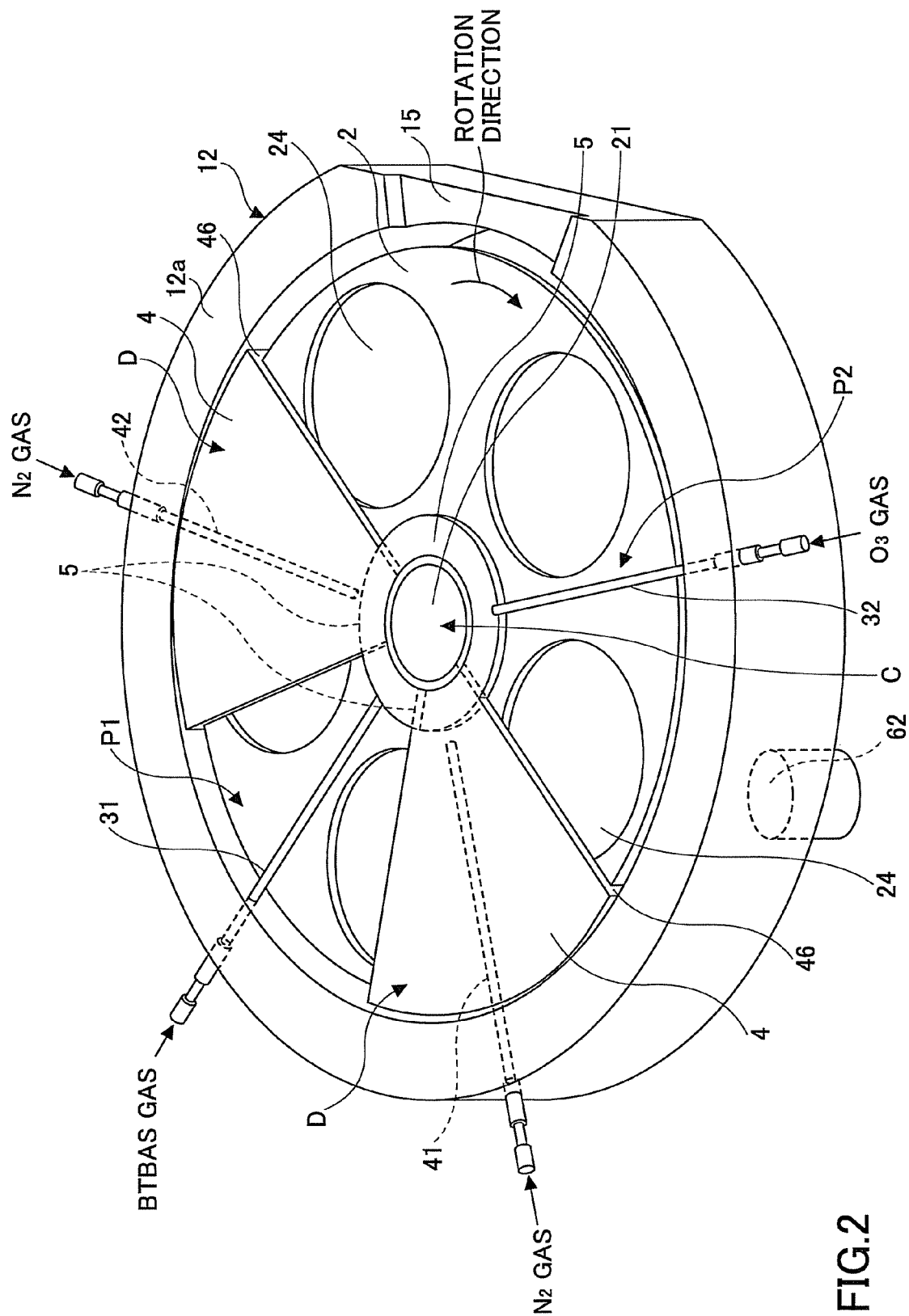
FIG. 2 is a perspective view of the film deposition apparatus, schematically illustrating its internal structure, according to the first embodiment of the present invention.
Figure 3:
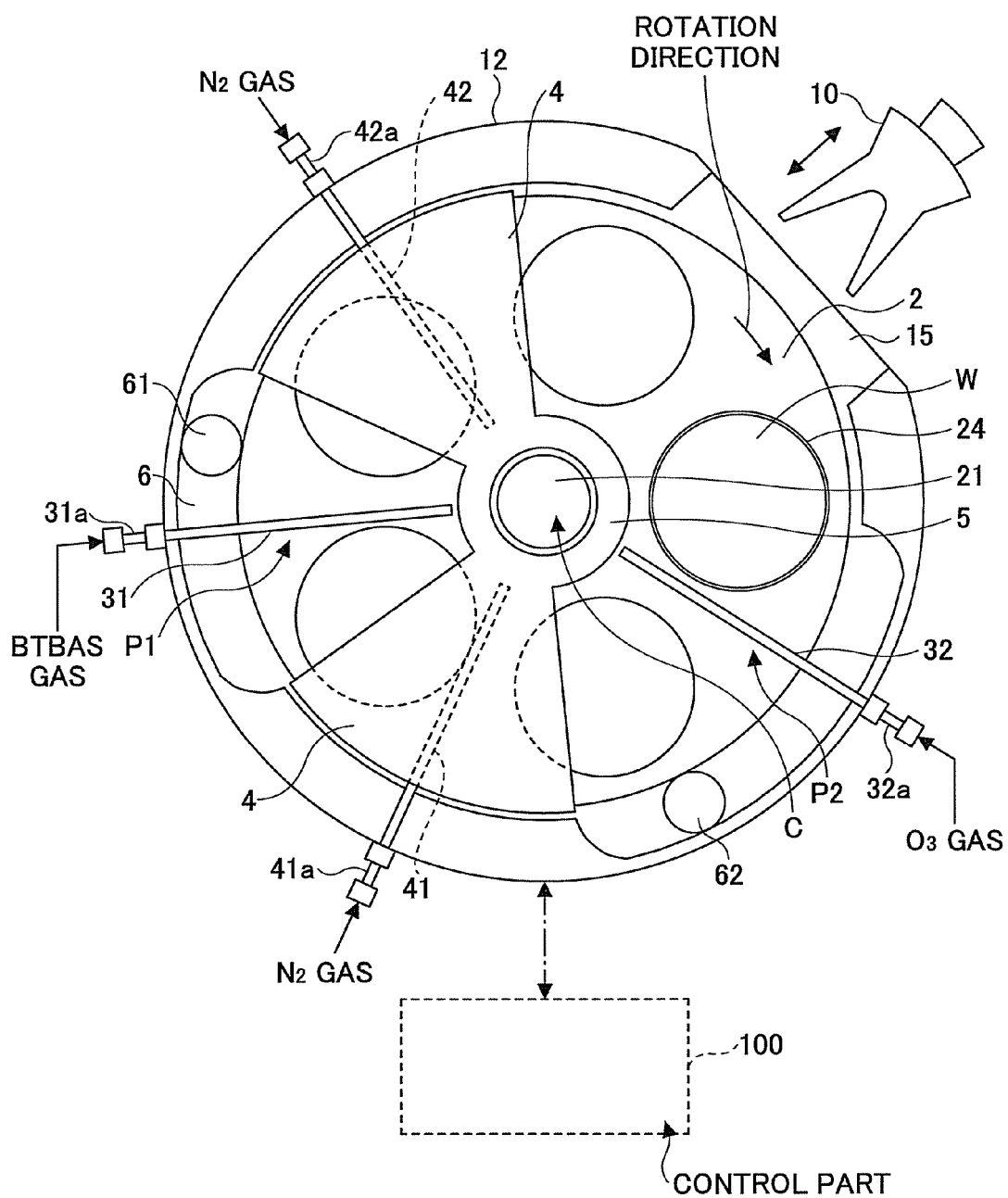
FIG. 3 is a plan view of the internal structure of the film deposition apparatus illustrated in FIG. 2 according to the first embodiment of the present invention.

Referring to FIG. 2 and FIG. 3, multiple, for example, five, circular depressed parts 24 for placing corresponding wafers, which are substrates, are provided in the surface part of the turntable 2 along its rotation direction (circumferential directions). In the case illustrated in FIG. 3, a wafer W is placed on only one of the depressed parts 24 by way of example.

FIGS. 4A and 4B are developed concentric sectional views of part of the turntable 2.

Referring to FIG. 4A, the depressed part 24 is slightly, for example, 4 mm, larger in diameter than the wafer W. Further, the depth of the depressed part 24 is substantially equal to the thickness of the wafer W. Accordingly, when the wafer W is dropped into the depressed part 24, the surface of the wafer W is level with the surface (of the region where no wafer W is placed) of the turntable 2. If there is a large difference in height between the surface of the wafer W and the surface of the turntable 2, a variation in pressure is caused where there is the difference. Therefore, in light of uniform in-plane film thickness, it is preferable that the surface of the wafer W and the surface of the turntable 2 be level with each other. Having the surface of the wafer W and the surface of the turntable 2 level with each other means that the surfaces are at the same height or the difference in heights of the surfaces is 5 mm or less, while it is preferable to have the difference in heights of the surfaces as close to zero as possible based on processing accuracy.

Through holes (not graphically illustrated) through which three elevation pins 16 (described below with reference to FIG. 8) move for supporting the bottom surface of the wafer W and moving the wafer W up and down are formed in the bottom part of the depressed part 24.

The depressed part 24, which is for positioning the wafer W and preventing the wafer W from flying out because of a centrifugal force caused by rotations of the turntable 2, corresponds to a substrate placement part according to this embodiment. The substrate placement part (wafer placement part) is not limited to a depressed part, and may be, for example, an arrangement of multiple guide members guiding the periphery of the wafer W along the circumference of the wafer W on the surface of the turntable 2. Alternatively, in the case of holding the wafer W by attraction by providing the turntable 2 with a chuck mechanism such as an electrostatic chuck, the substrate placement part may be a region where the wafer W is placed by the attraction.

Referring to FIG. 2 and FIG. 3, the vacuum chamber 1 includes a first reaction gas nozzle 31, a second reaction gas nozzle 32, and separation gas nozzles 41 and 42 above the turntable 2, which are provided at predetermined angular intervals to extend radially. This configuration allows the depressed parts 24 to pass below the nozzles 31, 32, 41, and 42. In the illustrated case, the second reaction gas nozzle 32, the separation gas nozzle 41, the first reaction gas nozzle 31, and the separation gas nozzle 42 are disposed clockwise in this order. These gas nozzles 31, 32, 41, and 42 penetrate through a peripheral wall part 12a of the chamber body 12 to have their respective ends, which are gas introduction ports 31a, 32a, 41a, and 42a, attached to the outer wall face of the peripheral wall part 12a. The gas nozzles 31, 32, 41, and 42 are supported by this configuration. The gas nozzles 31, 32, 41, and 42, which are introduced into the vacuum chamber 1 through the peripheral wall part 12a of the chamber body 12 in the illustrated case, may also be introduced through a below-described annular projecting part 5 (for example, FIG. 2). In this case, L-shaped conduits having respective first end openings at the peripheral surface of the projecting part 5 and respective second end openings at the outside surface of the ceiling plate 11 may be provided, so that the gas nozzles 31, 32, 41, and 42 may be connected to the first end openings of the corresponding conduits inside the vacuum chamber 1 and the gas introduction ports 31a, 32a, 41a, and 42a may be connected to the second end openings of the corresponding conduits outside the vacuum chamber 1.

The reaction gas nozzles 31 and 32 are connected to a source of bis(tertiary-butylamino) silane (BTBAS), which is a first reaction (source) gas, and a source of $O_3$ (ozone) gas, which is a second reaction (source) gas, respectively. (These sources are not graphically illustrated.) The separation gas nozzles 41 and 42 are connected to a source (not graphically illustrated) of $N_2$ (nitrogen) gas, which is a separation gas.

Each of the first and second reaction gas nozzles 31 and 32 has ejection holes 33 for ejecting the corresponding reaction gas arranged on its lower side at intervals along its length. Each of the separation gas nozzles 41 and 42 has ejection holes 40 for ejecting the separation gas arranged on its lower side at intervals along its length. The first and second reaction gas nozzles 31 and 32 correspond to a first reaction gas feed part and a second reaction gas feed part, respectively. The region below the first reaction gas nozzle 31 serves as a first process region P1 for causing BTBAS gas to be adsorbed on the surface of the wafer W, and the region below the second reaction gas nozzle 32 serves as a second process region P2 for causing $O_3$ gas to be adsorbed on the surface of the wafer W.

The separation gas nozzles 41 and 42 are provided to form separation regions D for separating the first process region P1 and the second process region P2. As illustrated in FIG. 2 through FIGS. 4A and 4B, a protruding part 4 is provided on the ceiling plate 11 of the vacuum chamber 1 in each of the separation regions D. Each protruding part 4 serves as a downward protruding ceiling plate having a planar shape of a sector that is a division of a circle centered on the rotation center of the turntable 2 and drawn near and along the inner wall face of the peripheral wall part 12a of the chamber body 12. Each of the separation gas nozzles 41 and 42 is housed in a groove part 43 formed to extend in a radial direction of the above-described circle at the circumferential center in the corresponding protruding part 4. That is, the distances between the center axis of each of the separation gas nozzles 41 and 42 and both edges (the upstream and downstream edges in the rotation direction) of the sector of the corresponding protruding part 4 are the same.

Accordingly, there are flat, low ceiling surfaces 44 (first ceiling surfaces), which serve as the lower surface of the protruding part 4, one on each circumferential side of each of the separation gas nozzles 41 and 42. Further, there are ceiling surfaces 45 (second ceiling surfaces), which are higher than the ceiling surfaces 44, one on each circumferential side of each protruding part 4. Each protruding part 4 serves to form a narrow separation space for preventing entrance and mixture of the first and second reaction gases between the protruding part 4 and the turntable 2.

That is, referring to FIG. 4B, the separation gas nozzle 41 serves to prevent entrance of $O_3$ gas from the upstream side in the rotation direction of the turntable 2 and to prevent entrance of BTBAS gas from the downstream side in the rotation direction of the turntable 2. "Preventing entrance of gas" means that $N_2$ gas, which is a separation gas ejected from the separation gas nozzle 41, is diffused between the first ceiling surfaces 44 and the surface of the turntable 2 to blow into spaces below the second ceiling surfaces 45 adjacent to the first ceiling surfaces 44 in this case, thereby making it impossible for gas to enter from the adjacent spaces. "Making it impossible for gas to enter" means not only that gas cannot enter the space below the protruding part 4 from an adjacent space at all, but also that entrance of $O_3$ gas and BTBAS gas from corresponding sides is allowed to some extent but prevention of their mixture inside the space below the protruding part 4 is ensured. As long as this effect is produced, the separation region D serves to separate the atmosphere of the first process region P1 and the atmosphere of the second process region P2. The gas adsorbed to the surface of the wafer W is allowed to pass through the separation region D. The "gas" in "preventing entrance of gas" means gas in a gaseous phase.

Referring to FIG. 1, FIG. 2, and FIG. 3, the annular projecting part 5 is provided on the lower surface of the ceiling plate 11 so as to have its inside circumferential edge facing the peripheral surface of the core part 21. The projecting part 5 is opposed to the turntable 2 in the region outside the core part 21. The projecting part 5 and the protruding parts 4 are formed as a unit so that the lower surfaces of the protruding parts 4 and the lower surface of the projecting part 5 form a single plane. That is, the height of the lower surface of the projecting part 5 from the turntable 2 is equal to the height of the lower surfaces of the protruding parts 4 (the first ceiling surfaces 44) from the turntable 2. These heights are hereinafter referred to as "height h." However, the projecting part 5 and the protruding parts 4 do not necessarily have to be a unit, and may be separate bodies. FIG. 2 and FIG. 3 illustrate the internal configuration of the vacuum chamber 1 without the ceiling plate 11 with the protruding parts 4 remaining inside the vacuum chamber 1.

The method of forming a combination structure of each of the separation gas nozzles 41 and 42 and the corresponding protruding part 4 is not limited to forming the groove 43 in the center of a sector-shaped plate to form the protruding part 4 and placing the separation gas nozzle 41 or 42 in the groove part 43, and may be fixing two sector-shaped plates to the lower surface of a ceiling plate body by bolting one on each side of each of the separation gas nozzles 41 and 42.

According to this embodiment, each of the separation gas nozzles 41 and 42 has the ejection holes 40, which are, for example, 0.5 mm in diameter, facing straight downward and arranged at intervals of, for example, 10 mm along the nozzle length. Further, each of the first and second reaction gas nozzles 31 and 32 has the ejection holes 33, which are, for example, 0.5 mm in diameter, facing straight downward and arranged at intervals of, for example, 10 mm along the nozzle length.

According to this embodiment, the wafer W is a substrate to be processed having a diameter of, for example, 300 mm. In this case, each protruding part 4 is, for example, 146 mm in circumferential length (the length of an arc of a circle concentric with the turntable 2) at its boundary with the projecting part 5 140 mm apart from the rotation center, and is, for example, 502 mm in circumferential length at the outermost peripheral part of the wafer placement region (the depressed parts 24). As illustrated in FIG. 4A, at the outermost peripheral part, letting the circumferential length of the protruding part 4 on each lateral side of the separation gas nozzle 41 (42) (the groove part 43) be L, L is, for example, 246 mm.

Further, as illustrated in FIG. 4B, the height h of the lower surface of the protruding part 4, that is, the first ceiling surfaces 44, from the surface of the turntable 2, may be approximately 0.5 mm to approximately 10 mm, and preferably, approximately 4 mm. In this case, the rotational speed of the turntable 2 is, for example, 1 rpm to 500 rpm. In order to ensure the separation function of the separation regions D, the size of the protruding parts 4 and the vertical distance between the lower surfaces (first ceiling surfaces 44) of the protruding parts 4 and the surface of the turntable 2 (that is, the height h) are determined in accordance with the operating rpm range of the turntable 2 based on, for example, experiments. The separation gas is not limited to $N_2$ gas, and may be an inert gas such as He gas or Ar gas or hydrogen gas. The separation gas is not limited to a particular type of gas as long as the gas does not affect a film deposition process.

As described above, the lower surface of the ceiling plate 11 of the vacuum chamber 1, that is, the ceiling surface relative to the wafer placement part (the depressed parts 24) of the turntable 2, circumferentially includes the first ceiling surfaces 44 and the second ceiling surfaces 45 higher than the first ceiling surfaces 44. FIG. 1 is a cross-sectional view of a region including the second ceiling surfaces 45, and FIG. 5 is a cross-sectional view of a region including one of the first ceiling surfaces 44.

As illustrated in FIG. 2 and FIG. 5, each sector-shaped protruding part 4 has its peripheral portion (portion on the peripheral side of the vacuum chamber 1) bent into an L-letter shape to be opposed to the peripheral surface of the turntable 2 so as to form a bent part 46. The sector-shaped protruding parts 4 are provided on the ceiling plate 11 and removable from the chamber body 12. Accordingly, there is a slight gap between the peripheral surface of the bent part 46 and the chamber body 12. The bent part 46 also is provided to prevent entrance of reaction gases from both sides of the protruding part 4 to prevent their mixture. The gap between the inside circumferential surface of the bent part 46 and the peripheral end face of the turntable 2 and the gap between the peripheral surface of the bent part 46 and the chamber body 12 are of the same size as the height h of the first ceiling surfaces 44 relative to the surface of the turntable 2. In this embodiment, the inside circumferential surface of the bent part 46 may be seen as part of the inner wall face of the peripheral wall part 12a of the chamber body 12 from the surface-side region of the turntable 2.

As illustrated in FIG. 5, the inner wall face of the peripheral wall part 12a of the chamber body 12 is formed as a vertical plane near the peripheral surface of the bent part 46 in the separation regions D. On the other hand, in regions other than the separation regions D, the peripheral wall part 12a of the chamber body 12 has portions having a rectangular longitudinal cross-sectional shape cut out so as to be depressed outward over a region from a portion opposed to the peripheral end face of the turntable 2 up to the bottom part 14 as illustrated in FIG. 1. These depressed portions are referred to as evacuation regions 6. Referring to FIG. 1 and FIG. 3, for example, two evacuation ports 61 and 62 are provided at the bottom of the corresponding evacuation regions 6. These evacuation ports 61 and 62 are connected to a common vacuum pump 64, which is an example of a vacuum evacuation part, through corresponding evacuation pipes 63. A pressure controller 65 is connected between the vacuum pump 64 and the evacuation ports 61 and 62. The pressure controller 65 may be provided for each of the evacuation ports 61 and 62 or may be common to the evacuation ports 61 and 62.

In a plan view, the evacuation ports 61 and 62 are provided on the corresponding sides of each separation region D in the rotation direction to be dedicated to evacuation of corresponding reaction gases (BTBAS gas and $O_3$ gas, respectively) in order to ensure the separation effect of the separation regions D. According to this embodiment, referring to FIG. 2 and FIG. 3, the evacuation port 61 is provided between the first reaction gas nozzle 31 and the separation region D adjacent to the first reaction gas nozzle 31 on its downstream side in the rotation direction, and the evacuation port 62 is provided between the second reaction gas nozzle 32 and the separation region D adjacent to the second reaction gas nozzle 32 on its downstream side in the rotation direction.

The number of evacuation ports provided is not limited to two. For example, the number of evacuation ports may be three with another evacuation port provided between the separation region D including the separation gas nozzle 42 and the second reaction gas nozzle 32 adjacent to the separation region D on its downstream side in the rotation direction, or may be four or more.

According to this embodiment, the evacuation ports 61 and 62 are provided at positions lower than the turntable 2 in the bottom part 14 so as to evacuate gases through the gap between the peripheral wall part 12a of the chamber body 12 (that is, the peripheral wall part or sidewall of the vacuum chamber 1) and the periphery of the turntable 2. Alternatively, the evacuation ports 61 and 62 may be provided in other parts than the bottom part 14 of the chamber body 12, such as the peripheral wall part 12a of the chamber body 12 (that is, the peripheral wall part or sidewall of the vacuum chamber 1). In the case of providing the evacuation ports 61 and 62 in the peripheral wall part 12a of the chamber body 12, the evacuation ports 61 and 62 may be provided at positions higher than the turntable 2. Providing the evacuation ports 61 and 62 in this manner causes gas on the turntable 2 to flow to outside the turntable 2. This is advantageous in that the blowing upward of particles is controlled compared with the case of evacuation through a ceiling surface opposed to the turntable 2.

Figure 6:
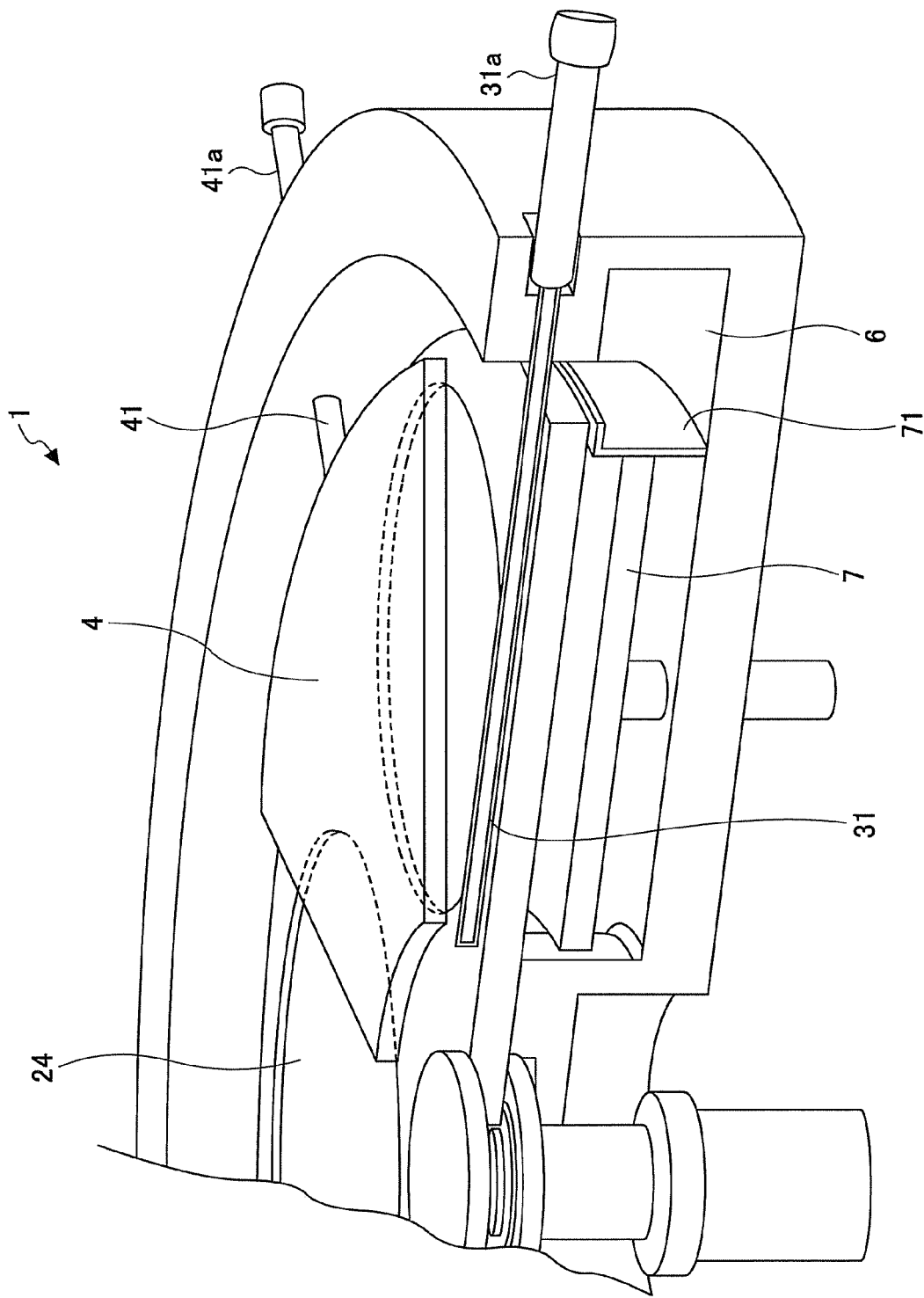
FIG. 6 is a cutaway perspective view of part of the film deposition apparatus according to the first embodiment of the present invention.

Referring to FIG. 1, FIG. 5, and FIG. 6, a heater unit 7 serving as a heating part is provided in the space between the turntable 2 and the bottom part 14 of the chamber body 12 (that is, the bottom part of the vacuum chamber 1) so as to heat the wafer W on the turntable 2 to a temperature determined by a process recipe through the turntable 2. A cover member 71 is provided around the heater unit 7 below and near the periphery of the turntable 2 so as to separate the atmosphere from a space above the turntable 2 to the evacuation regions 6 and the atmosphere in which the heater unit 7 is provided. The cover member 71 has its upper end bent outward into a flange shape to form a bent part 71a. The gap between the upper surface of the bent part 71a and the lower surface of the turntable 2 is reduced so as to prevent entrance of gas from outside to inside the cover member 71.

Near the rotation center inside the space where the heater unit 7 is provided, the bottom part 14 is close to the lower surface of the turntable 2 around its center and to the core part 21, so that the intervening space is narrow. Further, the gap (space) between the rotating shaft 22 and the inside circumferential surface of a through hole 14a through which the rotating shaft 22 is provided in the bottom part 14 is also narrow. These narrow spaces communicate with an inside of the case body 20. Further, the case body 20 is provided with a purge gas feed pipe 72 for feeding $N_2$ gas, which is a purge gas, into the narrow spaces to purge them. Further, multiple purge gas feed pipes 73, for purging the space where the heater unit 7 is provided, are connected to the bottom part 14 of the chamber body 12 at circumferential intervals below the heater unit 7.

Figure 7:
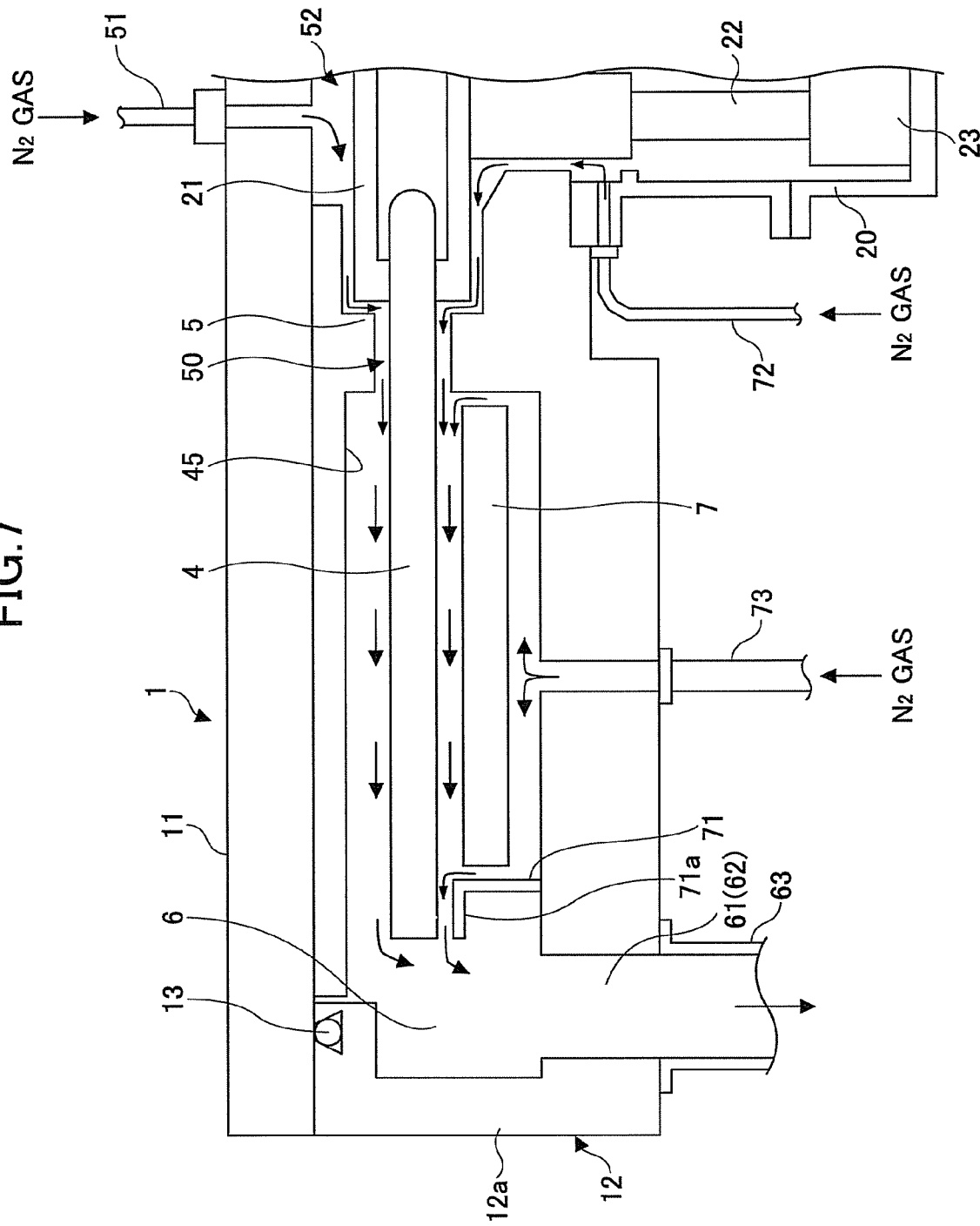
FIG. 7 is a diagram illustrating a separation gas flow and a purge gas flow according to the first embodiment of the present invention.

By thus providing the purge gas feed pipes 72 and 73, the space from inside the case body 20 to the space where the heater unit 7 is provided is purged with $N_2$ gas (purge gas), whose flow is indicated by arrows in FIG. 7. This purge gas is evacuated through the evacuation ports 61 and 62 via the evacuation regions 6 through the gap between the turntable 2 and the cover member 71. This prevents BTBAS gas or $O_3$ gas from moving from one to the other of the first and second process regions P1 and P2 through a space below the turntable 2. Accordingly, this purge gas also serves as a separation gas.

Further, a separation gas feed pipe 51 is connected to the center part of the ceiling plate 11 of the vacuum chamber 1 so as to feed $N_2$ gas, which is a separation gas, into a space 52 between the ceiling plate 11 and the core part 21. The separation gas fed into the space 52 is ejected toward the periphery of the turntable 2 along its upper surface (wafer placement part side surface) through a narrow gap 50 between the projecting part 5 and the turntable 2. The space surrounded by the projecting part 5 is filled with the separation gas. This prevents the reaction gases (BTBAS gas and $O_3$ gas) from being mixed through the center part of the turntable 2 between the first and second process regions P1 and P2. That is, the film deposition apparatus according to this embodiment may include a center part region C defined by the rotation center part of the turntable 2 and the vacuum chamber 1, purged with a separation gas, and having an ejection opening formed along the rotation direction for ejecting the separation gas onto the upper surface of the turntable 2, in order to separate the atmospheres of the first and second process regions P1 and P2. The ejection opening corresponds to the narrow gap 50 between the projecting part 5 and the turntable 2.

Figure 8:
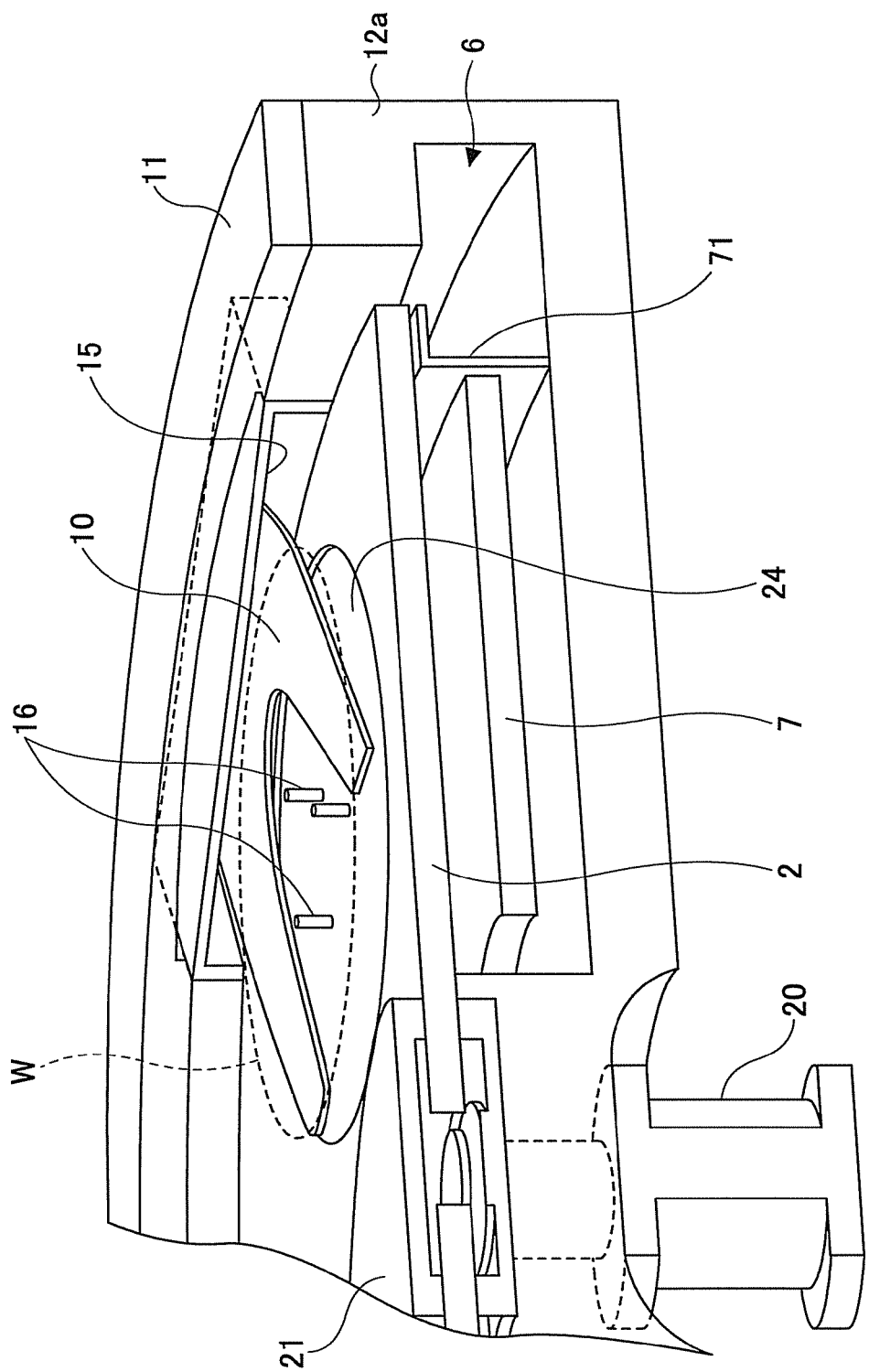
FIG. 8 is a cutaway perspective view of part of the film deposition apparatus according to the first embodiment of the present invention.

Further, as illustrated in FIG. 2, FIG. 3, and FIG. 8, a transfer opening 15 for transferring the wafer W, which is a substrate, between an external transfer arm 10 and the turntable 2 is formed in the peripheral wall part 12a of the chamber body 12. This transfer opening 15 is opened and closed by a gate valve (not graphically illustrated). The wafer W is transferred from/to the depressed part 24, which is a wafer placement part on the turntable 2, to/from the transfer arm 10 at a position facing the transfer opening 15. Accordingly, an elevation mechanism (not graphically illustrated) for the transfer elevation pins 16, which move through the depressed parts 24 to elevate the wafer W from its bottom side to a position corresponding to the transfer position, is provided below the turntable 2.

Further, the film deposition apparatus of this embodiment includes a control part 100 (FIG. 1) formed of a computer for controlling the operations of the apparatus. A program for causing the apparatus to operate is retained in a memory in the control part 100. This program is composed of step groups for causing the apparatus to perform operations described below, and is installed in the control part 100 from storage media such as a hard disk, a compact disk, a magneto-optical disk, a memory card, and a floppy disk.

Next, a description is given of action according to this embodiment. First, a gate valve (not graphically illustrated) is opened so that the transfer arm 10 transfers a wafer W from outside to one of the depressed parts 24 of the turntable 2 through the transfer opening 15. For this transfer of the wafer W, the elevation pins 16 move up from and down to the side of the bottom part 14 of the chamber body 12 through corresponding through holes in the bottom portion of the one of the depressed parts 24 as illustrated in FIG. 8 when the one of the depressed parts 24 stops at a position facing the transfer opening 15, that is, the transfer position.

This transfer of the wafer W may be repeated while rotating the turntable 2 intermittently, so that the five depressed parts 24 of the turntable 2 may receive respective wafers W. Next, the vacuum chamber 1 is evacuated with the vacuum pump 64 so that the pressure inside the vacuum chamber 1 reaches a preset value, and the wafers W are heated with the heater unit 7 while rotating the turntable 2 clockwise. For example, the turntable 2 is preheated to 300° C. with the heater unit 7, and the wafers W are placed on this turntable 2 to be heated. After determining that the temperature of the wafers W has reached a setpoint using a temperature sensor (not graphically illustrated), BTBAS gas and $O_3$ gas are ejected from the first and second reaction gas nozzles 31 and 32, respectively, and $N_2$ gas, which is a separation gas, is ejected from the separation gas nozzles 41 and 42.

The turntable 2 rotates so that the wafers W pass through the first process region P1 where the first reaction gas nozzle 31 is provided and the second process region P2 where the second reaction gas nozzle is provided alternately. As a result, BTBAS gas and then $O_3$ gas are adsorbed on the wafers W, so that BTBAS molecules are oxidized to form a single or multiple silicon oxide molecular layers. Silicon oxide molecular layers are thus stacked successively, so that a silicon oxide film of a predetermined thickness is deposited.

During the above-described film deposition operation, $N_2$ gas, which is a separation gas, is also fed from the separation gas feed pipe 51. As a result, the $N_2$ gas is ejected from the center part region C, that is, the gap 50 between the projecting part 5 and the turntable 2, and along the upper surface of the turntable 2. According to this embodiment, the spaces where the first and second reaction gas nozzles 31 and 32 are provided below the second ceiling surfaces 45 are lower in pressure than the narrow spaces between the first ceiling surfaces 44 and the turntable 2. This is because the evacuation regions 6 are provided adjacent to spaces below the second ceiling surfaces 45, and the spaces are evacuated directly through the corresponding evacuation regions 6. This is also because the narrow spaces are formed so that the difference in pressure between the narrow spaces and the spaces where the reaction gas nozzles 31 and 32 are provided or the first and second process regions P1 and P2 can be maintained by the height h.

Figure 9:
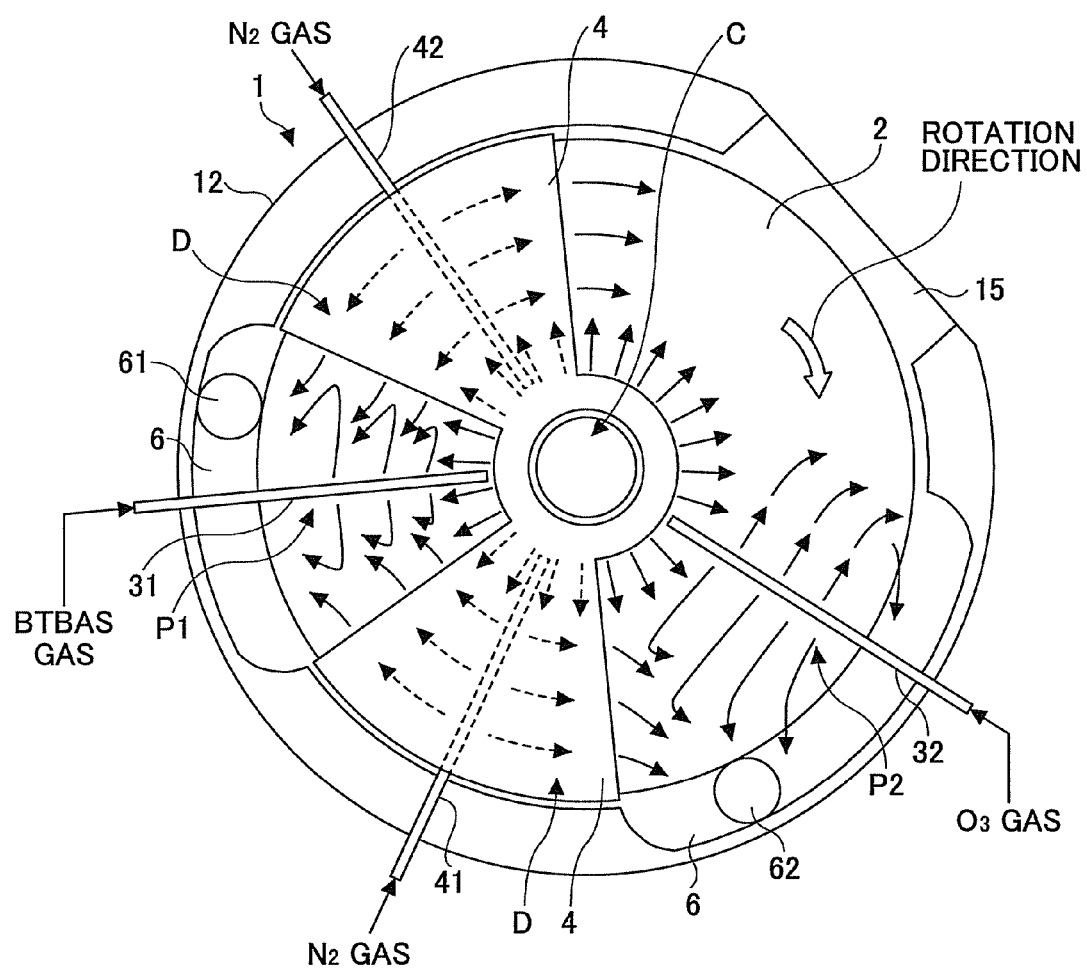
FIG. 9 is a diagram illustrating how a first reaction gas and a second reaction gas are separated by a separation gas and evacuated according to the first embodiment of the present invention.

Next, a description is given, with reference to FIG. 9, of flow patterns of gases fed into the vacuum chamber 1 from the gas nozzles 31, 32, 41, and 42. FIG. 9 is a schematic diagram illustrating flow patterns of gases. As illustrated in FIG. 9, part of the $O_3$ gas ejected from the second reaction gas nozzle 32 hits and flows along the upper surface of the turntable 2 (and the surface of the wafer W) in a direction opposite to the rotation direction of the turntable 2. Then, this part of the $O_3$ gas is pushed back by $N_2$ gas flowing from the upstream side in the rotation direction, and is redirected toward the periphery of the turntable 2 and the peripheral wall part 12a of the chamber body 12. Finally, this part of the $O_3$ gas flows into the evacuation region 6 and is evacuated from the vacuum chamber 1 through the evacuation port 62.

Further, $O_3$ gas is also ejected to the downstream side from the second reaction gas nozzle 32 and hits and flows along the upper surface of the turntable 2 (and the surface of the wafers W) to the downstream side in the rotation direction of the turntable 2. While this $O_3$ gas is caused to flow toward the evacuation port 62 by a flow of $N_2$ gas ejected from the center part region C and the suction action of the evacuation port 62, part of this $O_3$ gas flows toward the adjacent separation region D on the downstream side to try to enter a space below the sector-shaped protruding part 4. However, the height h (FIG. 4B) of the first ceiling surfaces 44 and the circumferential length of the protruding part 4 are set, in operating process parameters including the flow rates of gases, to such values as to make it possible to prevent gas from entering the space below the first ceiling surfaces 44 of the protruding part 4. Therefore, as illustrated also in FIG. 4B, the $O_3$ gas is hardly allowed into the space below the sector-shaped protruding part 4, or is prevented from reaching the vicinity of the separation gas nozzle 41 even if a small amount of the $O_3$ gas enters the space. In this case, the entered $O_3$ gas is pushed back by the $N_2$ gas ejected from the separation gas nozzle 41 to the upstream side in the rotation direction, that is, the second process region P2 side, so as to be evacuated, along with the $N_2$ gas ejected from the center part region C, from the evacuation port 62 through the gap between the periphery of the turntable 2 and the peripheral wall part 12a of the chamber body 12 and the evacuation region 6.

Further, the BTBAS gas ejected from the first reaction gas nozzle 31 to the downstream side to move toward the upstream and downstream sides in the rotation direction along the upper surface of the turntable 2 is prevented from entering spaces below the adjacent sector-shaped protruding parts 4 on the upstream and downstream sides in the rotation direction, or is pushed back toward the first process region P1 side even if a small amount of the BTBAS gas enters the spaces. As a result, the BTBAS gas, along with the $N_2$ gas ejected from the center part region C, is evacuated from the evacuation port 61 through the gap between the periphery of the turntable 2 and the peripheral wall part 12a of the chamber body 12 and the evacuation region 6. That is, in each separation region D, entrance of the BTBAS gas or $O_3$ gas, which is a reaction gas flowing through the atmosphere, is prevented, while the gas molecules adsorbed on the surface of the wafer W pass directly through the separation region D, that is, the space below the low ceiling surfaces 44 of the sector-shaped protruding part 4, so as to contribute to film deposition.

Further, the BTBAS gas in the first process region P1 and the $O_3$ gas in the second process region P2 flow toward the center part region C. As illustrated in FIG. 7 and FIG. 9, however, a separation gas is ejected from the center part region C to the periphery of the turntable 2 so as to prevent the gases from entering the center part region C or push back the gases even if a small amount of the gases enter the center part region C a little in amount. As a result, the BTBAS gas and the O3 gas are prevented from flowing into the second process region P2 and the first process region P1, respectively, through the center part region C.

Further, in each separation region D, the peripheral portion of the sector-shaped protruding part 4 is bent downward so that the gap between the bent part 46 and the peripheral end face of the turntable 2 is narrowed as described above to prevent substantial passage of gas. This also prevents the BTBAS gas in the first process region P1 and the $O_3$ gas in the second process region P2 from flowing into the second process region P2 and the first process region P1, respectively, through a space outside the turntable 2. Accordingly, the atmosphere of the first process region P1 and the atmosphere of the second process region P2 are completely separated by the two separation regions D, so that the BTBAS gas and the O3 gas are evacuated through the evacuation ports 61 and 62, respectively. As a result, the reaction gases, the BTBAS gas and the $O_3$ gas in this case, are mixed neither in the atmospheres nor on the wafer W. In this case, the space below the turntable 2 is purged with $N_2$ gas. Accordingly, there is no concern that gas entering the evacuation region 6 may flow into, for example, the BTBAS gas or $O_3$ gas feed region through the space below the turntable 2.

Figure 10A:
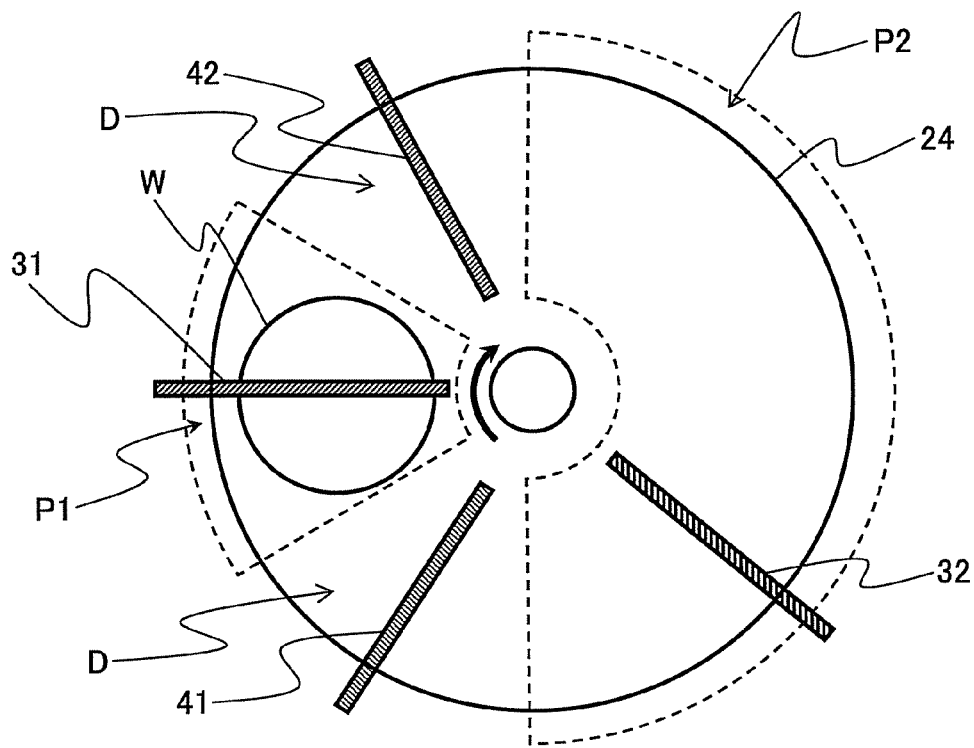
FIGS. 10A and 10B are plan views of a turntable, illustrating a film deposition method according to the first embodiment of the present invention.
Figure 10B:
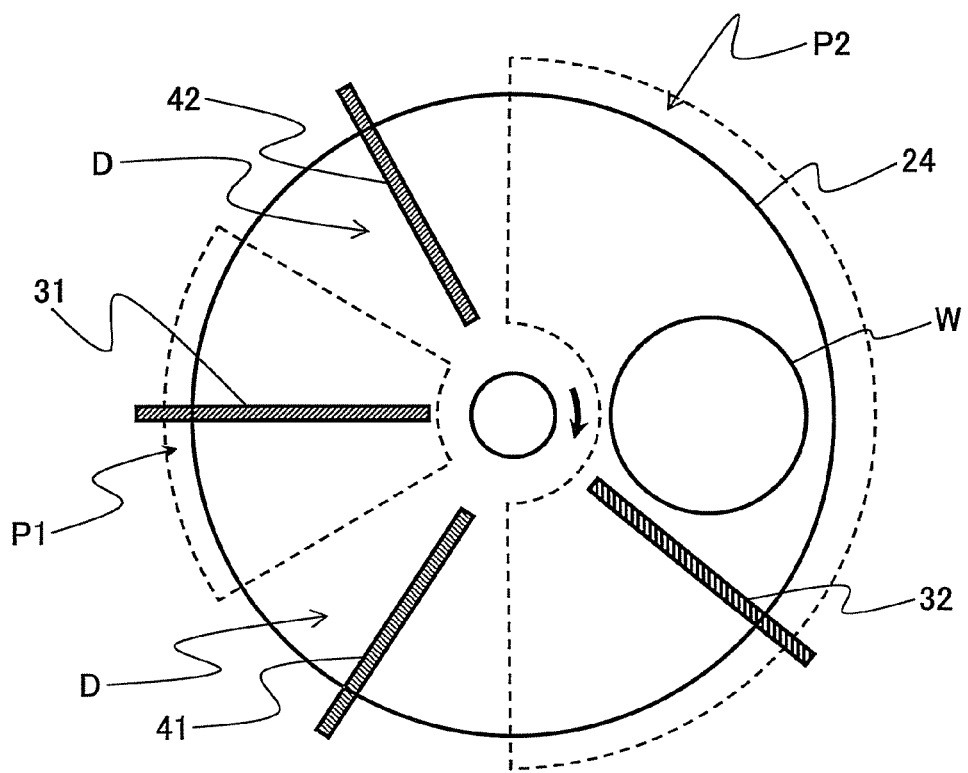

A description is given in more detail, with reference to FIGS. 10A and 10B, of this embodiment. According to this embodiment, film deposition is performed by changing the angular velocity of the turntable 2 during one (360-degree) revolution of the turntable 2.

That is, the process in the first process region P1, where fed BTBAS gas is adsorbed on the surface of the wafer W, is carried out in an extremely short period of time. On the other hand, the process in the second process region P2, where fed $O_3$ gas reacts with the BTBAS gas adsorbed on the surface of the wafer W so as to form a molecular layer of a silicon oxide, which is a reaction product, on the surface of the wafer W, is accompanied by a chemical reaction so as to take a longer time than the process in the first process region P1.

Therefore, the film deposition process is performed while changing the angular velocity during a rotation of the turntable 2 so that the angular velocity is higher when the wafer W passes through the first process region P1 and is lower when the wafer W passes through the second process region P2.

For example, as illustrated in FIG. 10A, the rotation of the turntable 2 is accelerated during passage of the wafer W through the separation region D formed by the $N_2$ gas ejected from the separation gas nozzle 41, so as to cause the wafer W to pass through the first process region P1 at an angular velocity of $8\pi$ rad/s (240 rpm). During this passage, BTBAS gas is fed from the first reaction gas nozzle 31, and the fed BTBAS gas is adsorbed on the surface of the wafer W instantaneously. Therefore, there is no problem in rotating the turntable 2 at high angular velocity.

Thereafter, the wafer W passes through the separation region D formed by the $N_2$ gas ejected from the separation gas nozzle 42. During this passage, the angular velocity of the turntable 2 is reduced to $4\pi$ rad/s (120 rpm).

Next, as illustrated in FIG. 10B, the wafer W is caused to pass through the second process region P2 at an angular velocity of $4\pi$ rad/s (120 rpm). During this passage, $O_3$ gas is fed from the second reaction gas nozzle 32, and the fed $O_3$ gas reacts with the BTBAS gas adsorbed on the surface of the wafer W, so that a molecular layer of a silicon oxide, which is a reaction product, is formed on the surface of the wafer W. During this passage, the angular velocity is low enough to ensure a sufficient time for forming a silicon oxide molecular layer on the surface of the wafer W through the reaction of the BTBAS gas and the $O_3$ gas.

Thereafter, the wafer W passes through the separation region D formed by the $N_2$ gas ejected from the separation gas nozzle 41. During this passage, the angular velocity of the turntable 2 is increased to $8\pi$ rad/s (240 rpm). Thereafter, the same as described above, the wafer W is caused to pass through the first process region P1 at high speed as illustrated in FIG. 10A, and the rotation as described above is repeated.

Performing film deposition while rotating the turntable 2 with different angular velocities as described above makes it possible to form a compact silicon oxide film on the surface of the wafer W. Further, since it is possible to change the angular velocity in accordance with processes during a single revolution of the turntable 2, it is possible to ensure a desired and sufficient time for each process, so that it is possible to produce a compact, high-quality film without loss of time. Further, since there is no loss of time in performing each process, it is also possible to reduce a process time per wafer W.

The angular velocity control at the time of rotating the turntable 2 is performed by controlling rotations in the drive part 23 based on a control signal transmitted from the control part 100 to the drive part 23.

When the film deposition process is thus completed, wafers W are successively carried out by the transfer arm 10 in the way opposite to their carrying-in operation.

Here, a description is given of examples of process parameters, which include, for example, a process pressure of 1067 Pa (8 Torr), a wafer W heating temperature of 350° C., a BTBAS gas flow rate of 100 sccm, an $O_3$ gas flow rate of 10,000 sccm, a flow rate of $N_2$ gas (from the separation gas nozzles 41 and 42) of 20,000 sccm, and a flow rate of $N_2$ gas (from the separation gas feed pipe 51 at the center of the vacuum chamber 1) of 5000 sccm. Further, the number of reaction gas feed cycles per wafer, that is, the number of times a wafer passes through each of the first and second process regions P1 and P2, differs depending on a desired film thickness, and may be, for example, 600.

According to this embodiment, the film deposition apparatus includes the separation regions D with the low ceiling surfaces 44 between the first process region P1 where BTBAS gas is fed and the second process region P2 where $O_3$ gas is fed. This prevents the BTBAS gas and the $O_3$ gas from flowing into the second process region P2 and the first process region P1, respectively, to be mixed with each other. Accordingly, an MLD (or ALD) mode deposition of a silicon oxide film is ensured by rotating the turntable 2 having the wafers W placed thereon to cause the wafers W to pass through the first process region P1, the separation region D, the second process region P2, and the separation region D. In addition, the separation regions D further include the separation gas nozzles 41 and 42 to eject $N_2$ gas in order to further ensure that the BTBAS gas and the $O_3$ gas are prevented from flowing into the second process area P2 and the first process area P1, respectively, to be mixed with each other. Furthermore, the vacuum chamber 1 of the film deposition apparatus according to this embodiment includes the center part region C having an ejection opening from which $N_2$ gas is ejected. This makes it possible to prevent the BTBAS gas and the $O_3$ gas from flowing into the second process area P2 and the first process area P1, respectively, through the center part area C to be mixed with each other. Moreover, since the BTBAS gas and the $O_3$ gas are prevented from being mixed with each other, a silicon oxide is hardly deposited on the turntable 2, so that it is possible to reduce the problem of particles.

According to the film deposition apparatus of this embodiment, the turntable 2 has the five depressed parts 24, so that five wafers W placed in the corresponding depressed parts 24 may be processed in a single run. However, only one of the five depressed parts 24 may be loaded with a wafer W. Alternatively, the turntable 2 may have only one depressed part 24.

Examples of process gases applicable in the present invention other than the above-described BTBAS gas include dichlorosilane (DCS), hexachlorodisilane (HCD), trimethyl aluminum (TMA), tris(dimethyl amino) silane (3DMAS), tetrakis-ethyl-methyl-amino-hafnium (TEMHF), bis(tetra methyl heptandionate) strontium $(Sr(THD)_2)$, (methyl-pentadionate)(bis-tetra-methyl-heptandionate)titanium (Ti(MP-D)(THD)), and monoamino-silane.

Further, in each separation region D, it is preferable that the first ceiling surface 44 on the upstream side in the rotation direction of the turntable 2 relative to the separation gas nozzle 41 or 42 have its width in the rotation direction increasing toward the periphery. This is because a flow of gas caused to flow toward the separation region D from the upstream side by the rotation of the turntable 2 is faster at a position closer to the periphery. From this viewpoint, it is expedient to form the protruding parts 4 into a sector shape as described above.

Figure 11A:
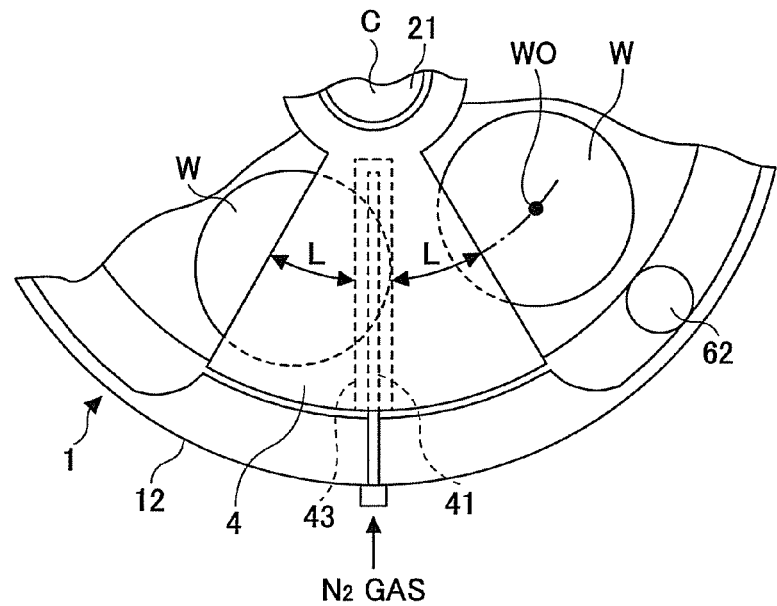
FIGS. 11A and 11B are diagrams for illustrating dimensions of a protruding part used for the separation region according to the first embodiment of the present invention.
Figure 11B:
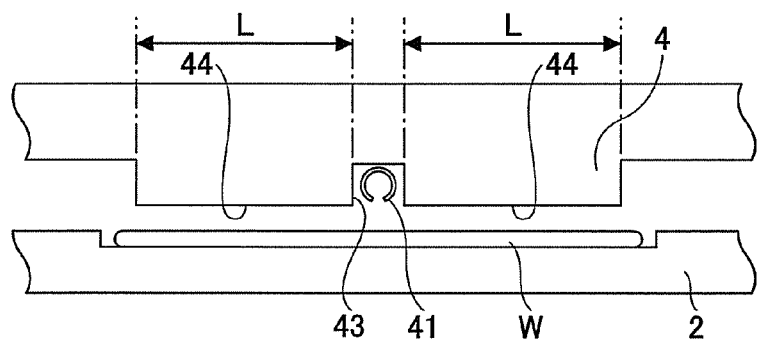

The size of the protruding portions 4 (or the first ceiling surfaces 44) is illustrated again with examples below. Referring to FIGS. 11A and 11B, letting the length of an arc of each of the first ceiling surfaces 44 forming narrow spaces one on each side of the separation gas nozzle 41 (42), which arc corresponds to the passage of a wafer center WO, be L, L is preferably greater than or equal to approximately one-tenth of the diameter of the wafer W and less than or equal to approximately the diameter of the wafer W, and more preferably, approximately one-sixth or more of the diameter of the wafer W. For example, if the wafer W is 300 mm in diameter, it is preferable that this length L be greater than or equal to approximately 50 mm.

If this length L is insufficiently small, the height h (FIG. 4B) of the narrow space between the first ceiling surfaces 44 and the turntable 2 should be reduced in order to effectively prevent a reaction gas from flowing into the narrow space. However, if the length L is too small and the height h is extremely small, the turntable 2 may collide with the first ceiling surfaces 44, so that particles may be generated to contaminate or damage the wafer W. Accordingly, it is necessary to take measures to control vibrations of the turntable 2 or to cause the turntable 2 to rotate stably in order to prevent the turntable 2 from colliding with the first ceiling surfaces 44.

On the other hand, in the case of keeping the height h of the narrow space relatively large with the length L remaining small, the rotational speed of the turntable 2 should be reduced to prevent a reaction gas from flowing into the narrow space between the first ceiling surfaces 44 and the turntable 2, which is a disadvantage in manufacturing throughput.

From these considerations, it is preferable that the length L of each first ceiling surface 44 along an arc corresponding to the passage of the wafer center WO be greater than or equal to approximately 50 mm. However, the protruding parts 4 or the first ceiling surfaces 44 are not limited to the above-described size, and may be adjusted in accordance with process parameters used or wafer size. Further, as long as the narrow space has such a height as to form a flow of a separation gas from the separation region D to the first and second process regions P1 and P2, the height h of the narrow space may also be adjusted in accordance with process parameters used, wafer size, and additionally, for example, the area of the first ceiling surfaces 44, as is clear from the above description.

Figure 12:
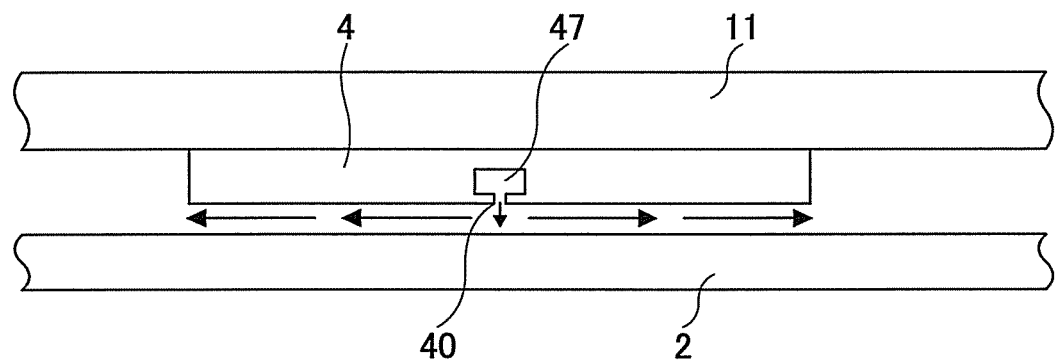
FIG. 12 is a cross-sectional view of part of the film deposition apparatus, illustrating another example of the separation region, according to the first embodiment of the present invention.

Further, according to this embodiment, the separation gas nozzles 41 and 42 are provided in the corresponding groove parts 43 provided in the protruding parts 4, and the first ceiling surfaces 44 are arranged one on each side of each of the separation gas nozzles 41 and 42. Alternatively, according to a variation, as illustrated in FIG. 12, the separation gas nozzle 41 or 42 may be replaced with a channel 47 formed in the protruding part 4 so as to extend in the directions of the diameter of the turntable 2. The ejection holes 40 may be formed on the channel 47 along its length so as to eject a separation gas ($N_2$ gas) from these ejection holes 40.

Figure 13A:
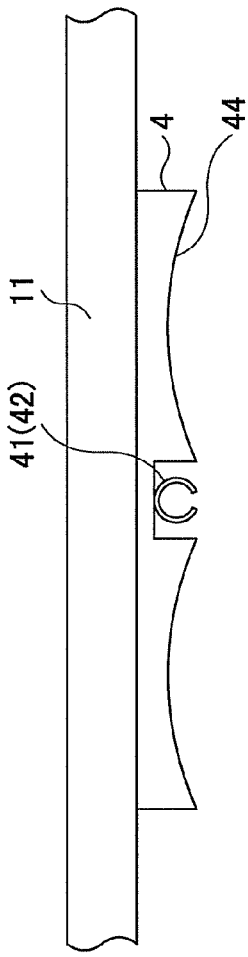
FIGS. 13A through 13C are cross-sectional views of part of the film deposition apparatus, illustrating other examples of the protruding part used for the separation region, according to the first embodiment of the present invention.
Figure 13B:
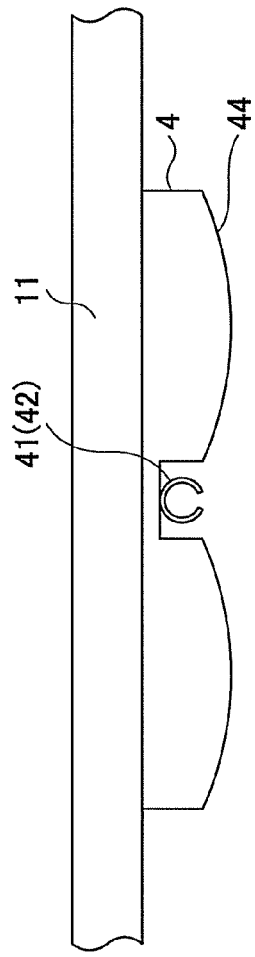
Figure 13C:
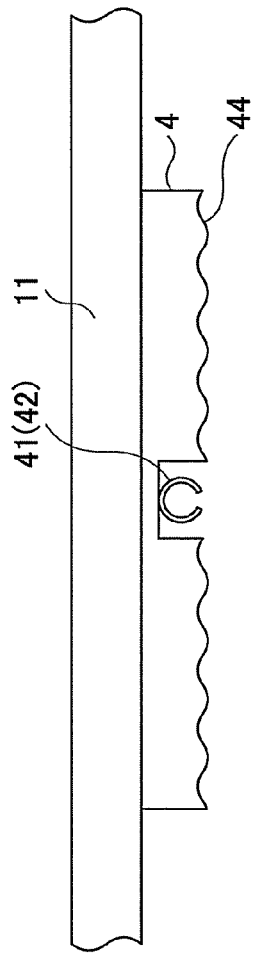

The first ceiling surfaces 44 of the separation regions D are not limited to flat surfaces, and may be concave as illustrated in FIG. 13A, convex as illustrated in FIG. 13B, or corrugated as illustrated in FIG. 13C.

Further, the protruding parts 4 may be hollow so as to introduce a separation gas into their respective hollow spaces. In this case, multiple ejection holes 40a may be arranged as illustrated in FIG. 14A, FIG. 14B, or FIG. 14C.

Figure 14A:
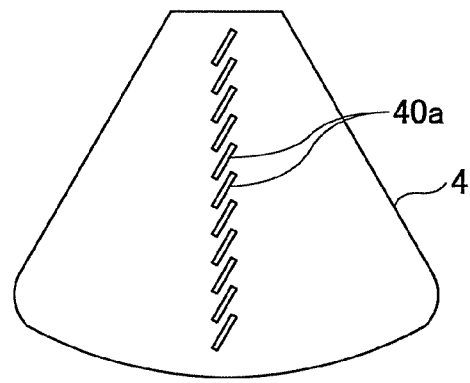
FIGS. 14A through 14C are bottom views of the protruding part, illustrating other examples of ejection holes, according to the first embodiment of the present invention.

FIG. 14A illustrates a configuration where the ejection holes 40a, formed of multiple elongated slits inclined to the diameter of the turntable 2, are spaced along the directions of the diameter so that adjacent ejection holes 40a overlap each other in the directions of the diameter.

Figure 14B:
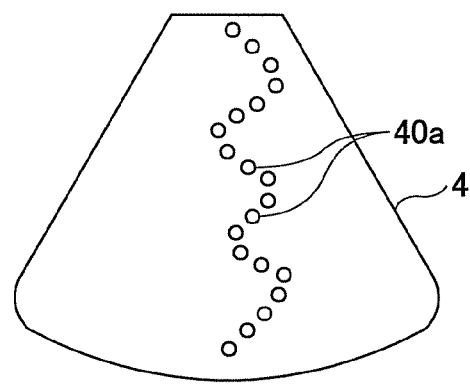

FIG. 14B illustrates a configuration where the ejection holes are arranged along a serpentine line.

Figure 14C:
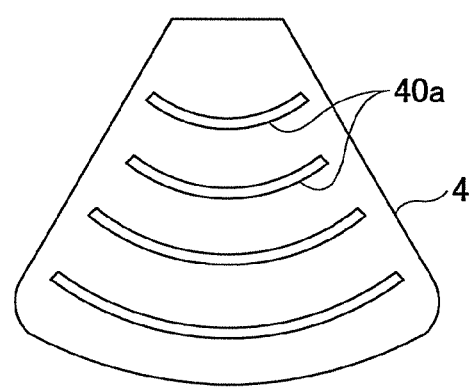

FIG. 14C illustrates a configuration where the ejection holes 40a, formed of multiple arcuate slits, are spaced in the directions of the diameter toward the periphery of the turntable 2.

Figure 15A:
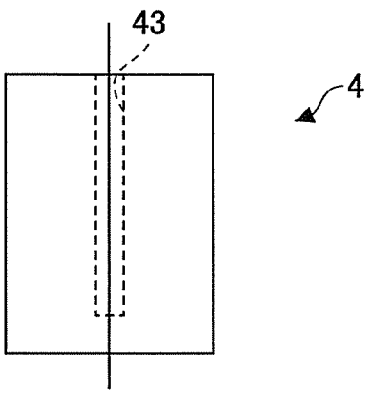
FIG. 15A through 15D are plan views of other examples of the protruding part according to the first embodiment of the present invention.
Figure 15B:
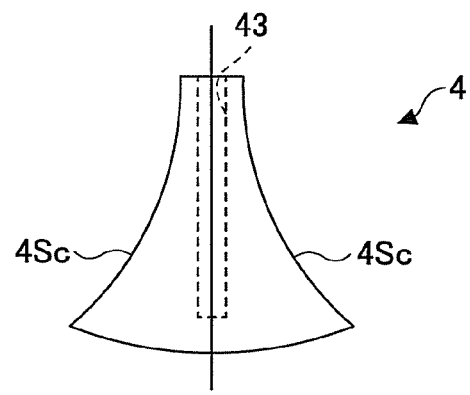
Figure 15C:
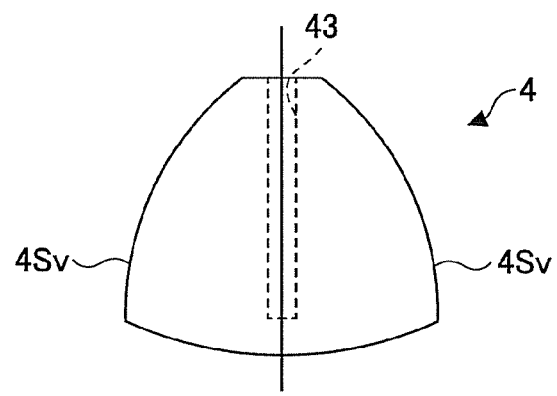
Figure 15D:
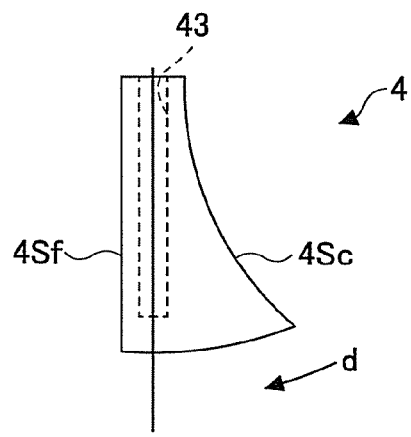

Further, according to this embodiment, the upper surfaces of the protruding parts 4 have a substantial sector shape. According to a variation, the upper surfaces may have a rectangular or square shape as illustrated in FIG. 15A. Alternatively, the protruding parts 4 may have an upper surface having a general shape of a sector and concave side surfaces 4Sc as illustrated in FIG. 15B. Alternatively, the protruding parts 4 may have an upper surface having a general shape of a sector and convex side surfaces 4Sv as illustrated in FIG. 15C. Alternatively, the protruding parts 4 may have the concave side surface 4Sc on the upstream side in the rotation direction of the turntable 2 (indicated by arrow d in FIG. 15D) and a flat side surface 4Sf on the downstream side in the rotation direction of the turntable 2 as illustrated in FIG. 15D. In FIGS. 15A through 15D, the groove part 43 (FIGS. 4A and 4B) formed in the protruding part 4 is indicated by broken lines. In these illustrated cases, the separation gas nozzle 41 or 42 (FIG. 2) contained in the groove part 43 extends from the center part, for example, the projecting part 5 (FIG. 1), of the vacuum chamber 1.

According to this embodiment, the heater unit 7 is employed as a heating part for heating the wafer W. The heater unit 7 is not limited to a heater using a resistance heating element, and may be a lamp heater. Further, the heater unit 7 may be provided above the turntable 2 or above and below the turntable 2 instead of being provided below the turntable 2.

Figure 16:
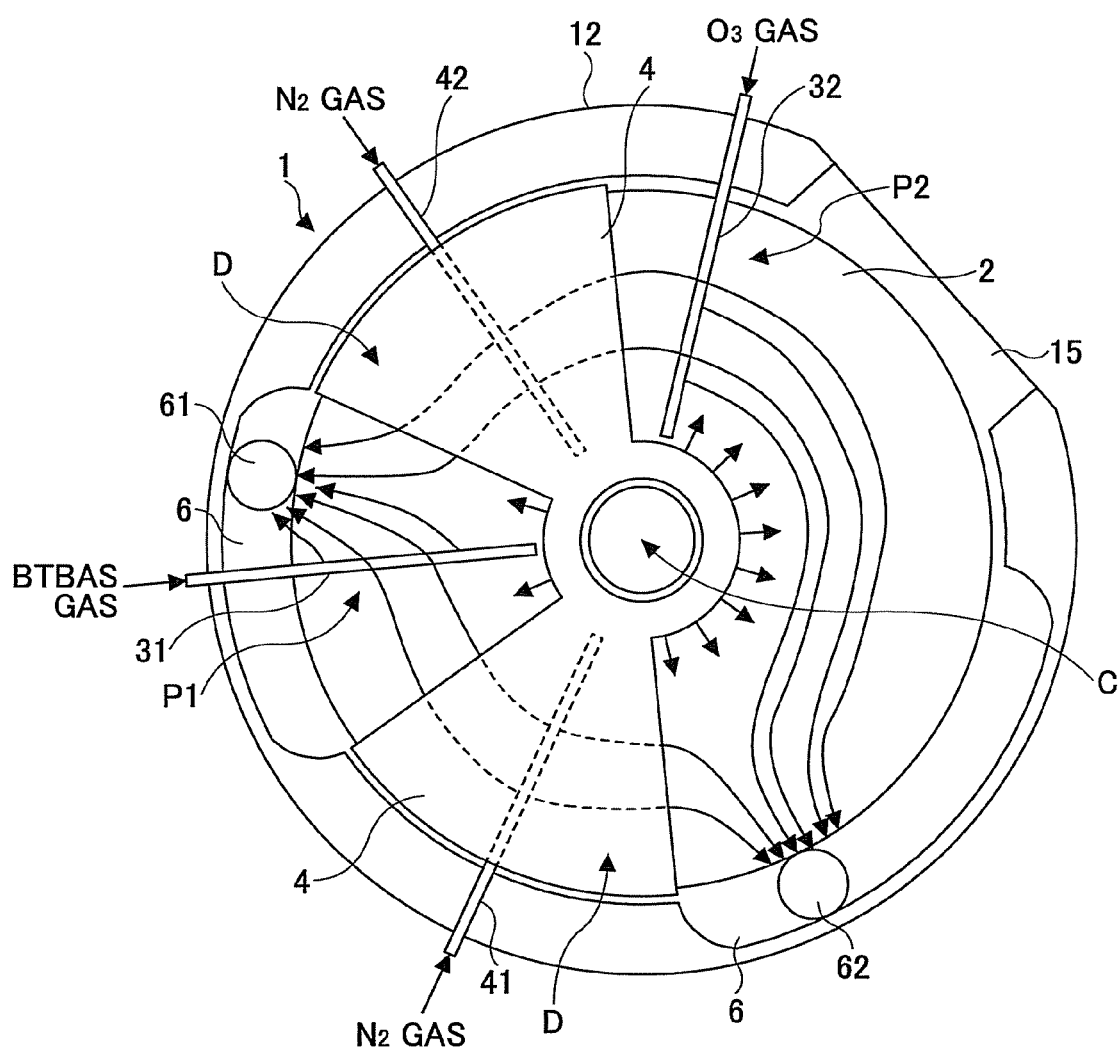
FIG. 16 is a plan view of the internal structure of the film deposition apparatus according to a variation of the first embodiment of the present invention.

Here, a description is given of layouts of the first and second process regions P1 and P2 and the separation regions D other than the layout described above according to this embodiment. FIG. 16 illustrates a case where the second reaction gas nozzle 32 is positioned on the upstream side of the transfer opening 15 in the rotation direction of the turntable 2. The same effects are produced with such a layout.

Figure 17:
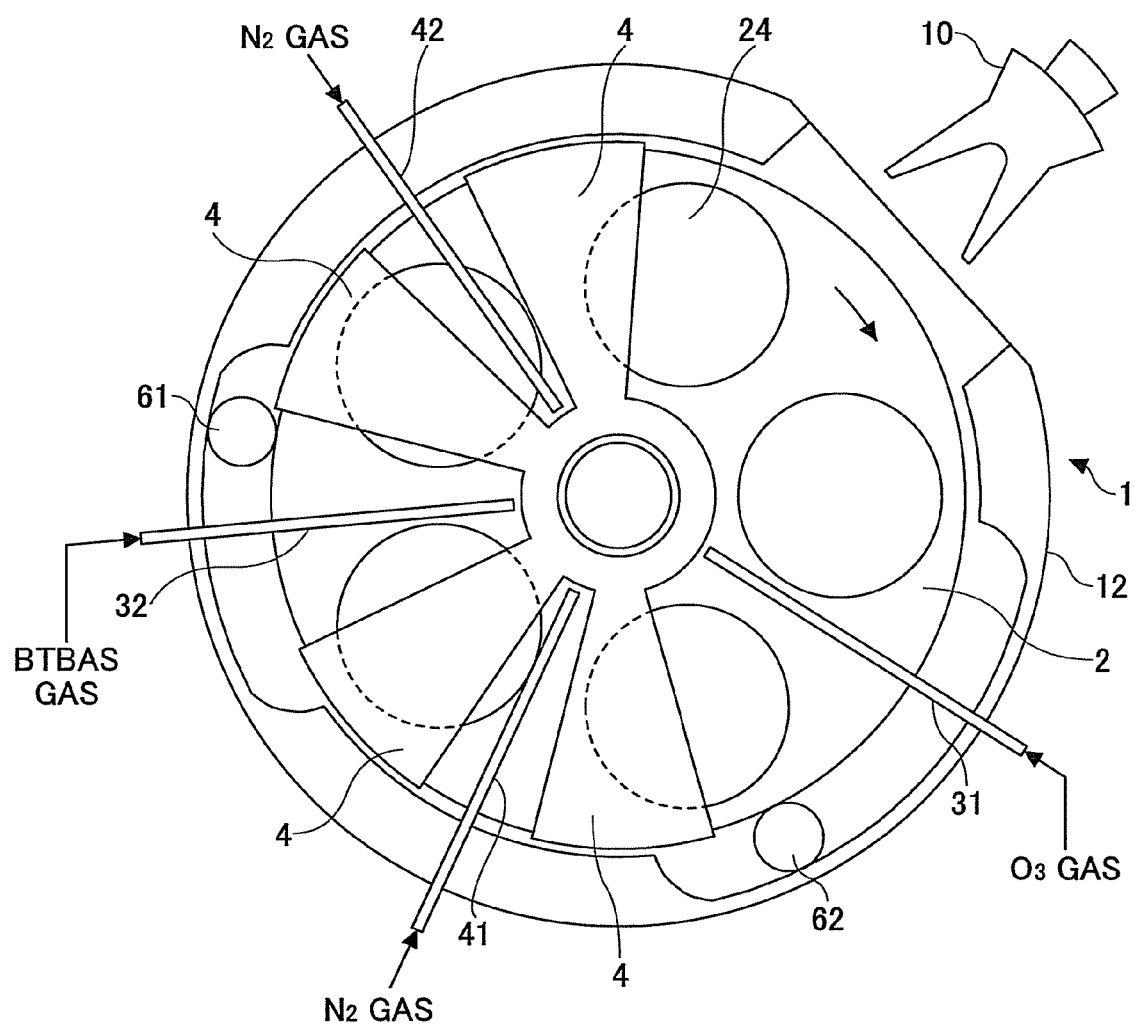
FIG. 17 is a plan view of the internal structure of the film deposition apparatus according to another variation of the first embodiment of the present invention.

Further, each separation region D may be configured so that the sector-shaped protruding part 4 is divided into two portions in a circumferential direction with the separation nozzle 41 or 42 provided between the two portions. FIG. 17 is a plan view of such a configuration. In this case, the distance between each of sector-shaped protruding part 4 (divided portion) and the separation gas nozzle 41 or 42 and the size of each sector-shaped protruding part 4 (divided portion) may be determined in consideration of the ejection flow rate of a separation gas and the ejection flow rate of a reaction gas so as to allow the separation region D to produce an effective separation effect.

Figure 18:
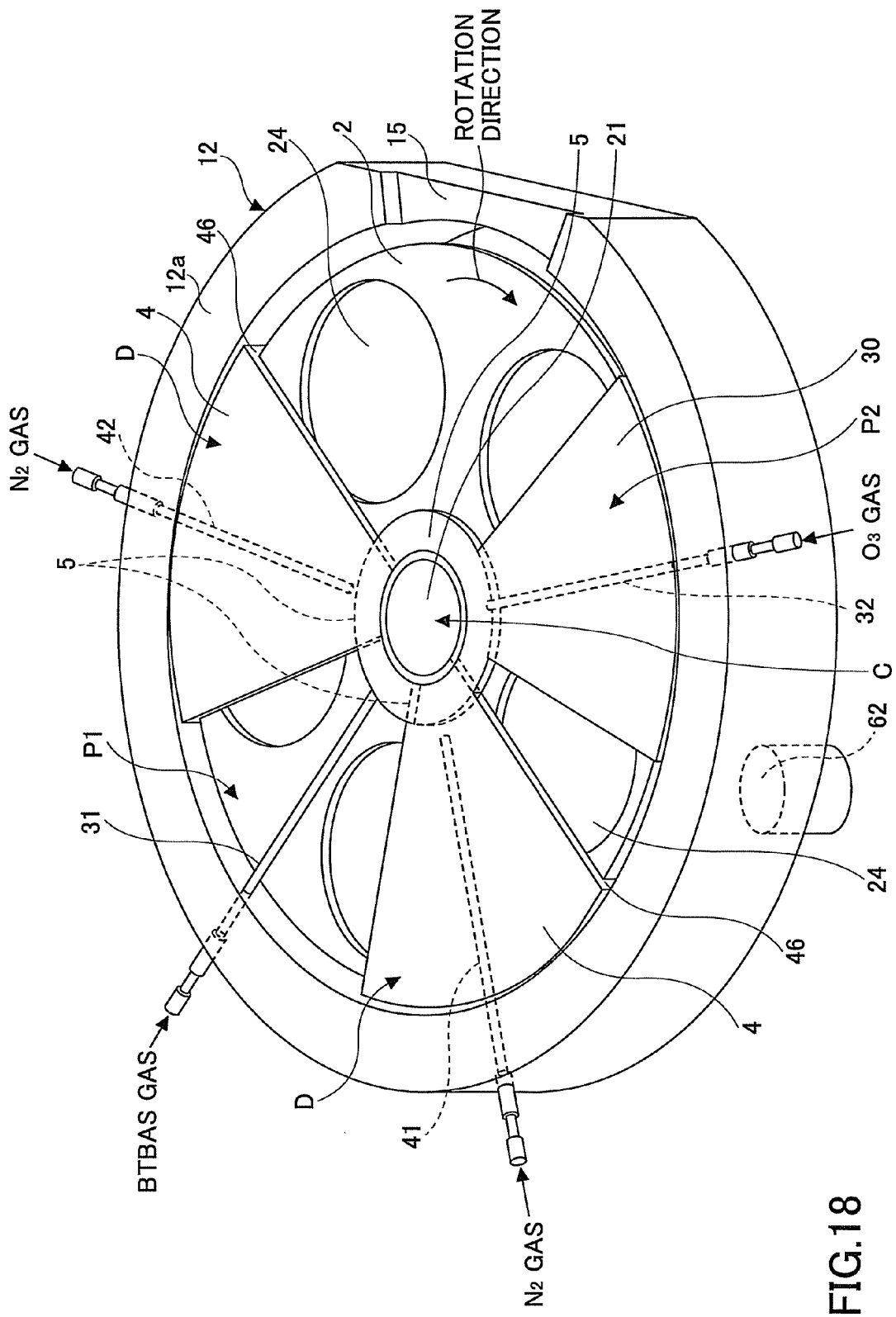
FIG. 18 is a perspective view of the internal structure of the film deposition apparatus according to yet another variation of the first embodiment of the present invention.

According to this embodiment, the first and second process regions P1 and P2 correspond to regions having the second ceiling surfaces 45 higher than the first ceiling surfaces 44 of the separation regions D. Alternatively, at least one of the first and second process regions P1 and P2 may have other ceiling surfaces that are opposed to the turntable 2 on both sides of the reaction gas nozzle 31 or 32 and are lower than the first ceiling surface 45, in order to prevent gas from flowing into the gap between the other ceiling surfaces and the turntable 2. The other ceiling surfaces may be lower than the first ceiling surfaces 45 and as low as the first ceiling surfaces 44 of the separation regions D. FIG. 18 illustrates such a configuration. As illustrated in FIG. 18, a sector-shaped protruding part 30 is provided in the second process region P2 where $O_3$ gas is fed, and the reaction gas nozzle 32 is provided in a groove part (not graphically illustrated) formed in the protruding part 30. In other words, the second process region P2, which is used for the reaction gas nozzle 32 to feed a reaction gas, has the same configuration as the separation regions D. The protruding part 30 may be configured the same as the hollow protruding part 4 illustrated in FIG. 14A, 14B, or 14C.

Figure 19:
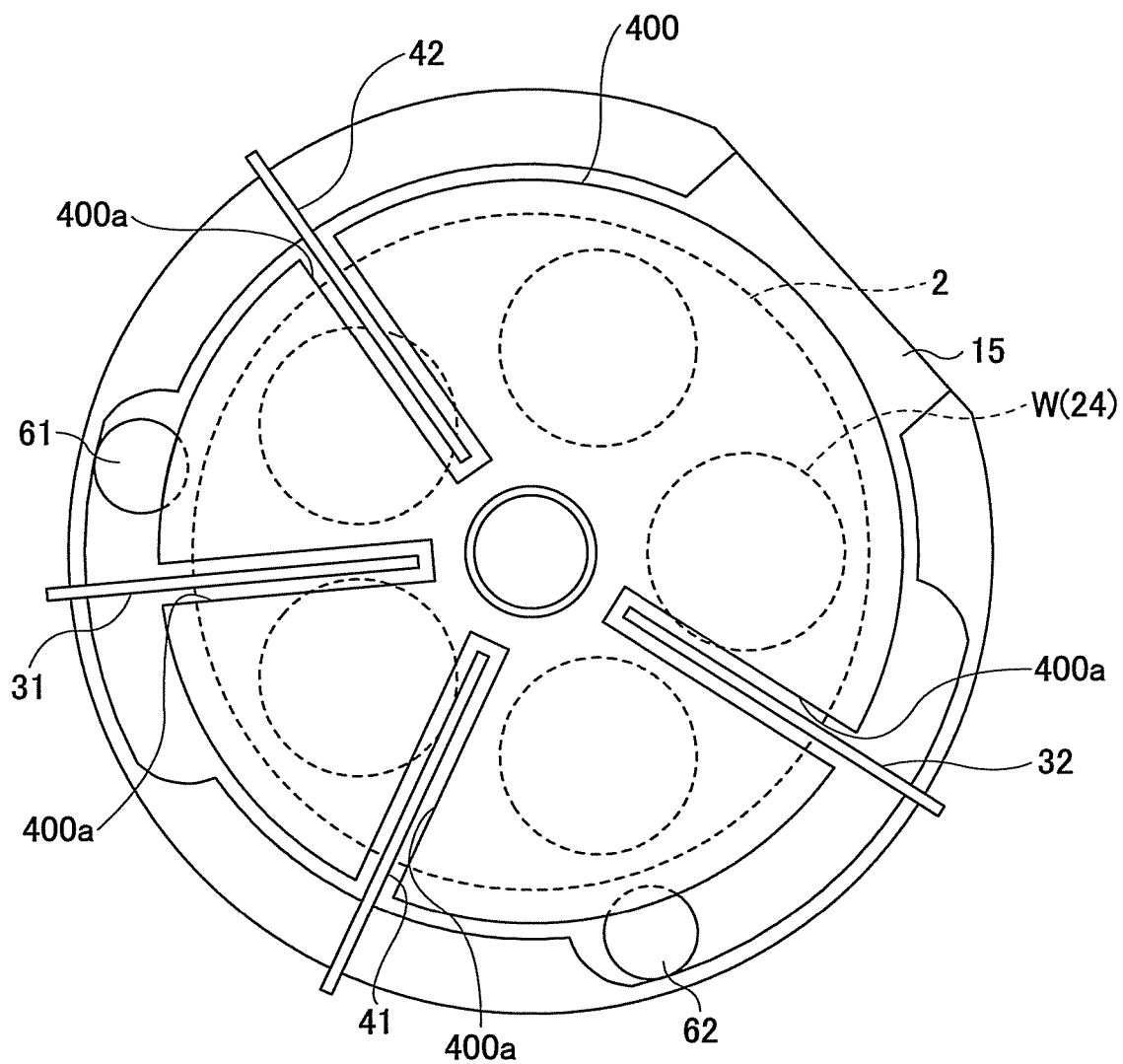
FIG. 19 is a plan view of the internal structure of the film deposition apparatus according to yet another variation of the first embodiment of the present invention.

Further, according to a variation, as illustrated in FIG. 19, the above-described ceiling surfaces, that is, the ceiling surfaces lower than the first ceiling surfaces 45 and as low as the first ceiling surfaces 44, may be provided for each of the reaction gas nozzles 31 and 32 so as to extend to reach the first ceiling surfaces 44 as long as the low ceiling surfaces (first ceiling surfaces) 44 are provided to form a narrow space on each side of each of the separation gas nozzles 41 and 42. That is, in place of the protruding parts 4, another protruding part 400 may be attached to the lower surface of the ceiling plate 11.

The protruding part 400 has a substantial disk shape, and is opposed to the substantially entire upper surface of the turntable 2. The protruding part 400 includes four radially extending slots 400a that accommodate the corresponding gas nozzles 31, 32, 41, and 42. Further, a narrow space is left below the protruding part 400 relative to the turntable 2. The height of the narrow space may be substantially equal to the above-described height h (FIG. 4B). In the case of using the protruding part 400, the reaction gases ejected from the reaction gas nozzles 31 and 32 are diffused to both sides of the corresponding reaction nozzles 31 and 32 below the protruding part 400 (or the narrow space), and the separation gas ejected from the separation gas nozzles 41 and 42 are diffused to both sides of the reaction nozzles 41 and 42 below the protruding part 400 (or the narrow space). The reaction gases and the separation gas merge in the narrow space to be evacuated through the evacuation ports 61 and 62. Even in this case, the reaction gas ejected from the reaction gas nozzle 31 is prevented from mixing with the reaction gas ejected from the reaction gas nozzle 32, so that a proper ALD (or MLD) mode film deposition is performed.

The protruding part 400 may be formed by combining the hollow protruding parts 4 illustrated in any of FIGS. 14A through 14C so as to eject the reaction gases and the separation gas from the corresponding ejection holes 40a of the corresponding hollow protruding parts 4 without using the gas nozzles 31, 32, 41, and 42 and the slits 400a.

According to this embodiment, the rotating shaft 22 of the turntable 2 is positioned in the center part of the vacuum chamber 1, and the space 52 between the ceiling plate 11 and the core part 21 is purged with a separation gas. Alternatively, this embodiment may be configured as illustrated in FIG. 20.

Figure 20:
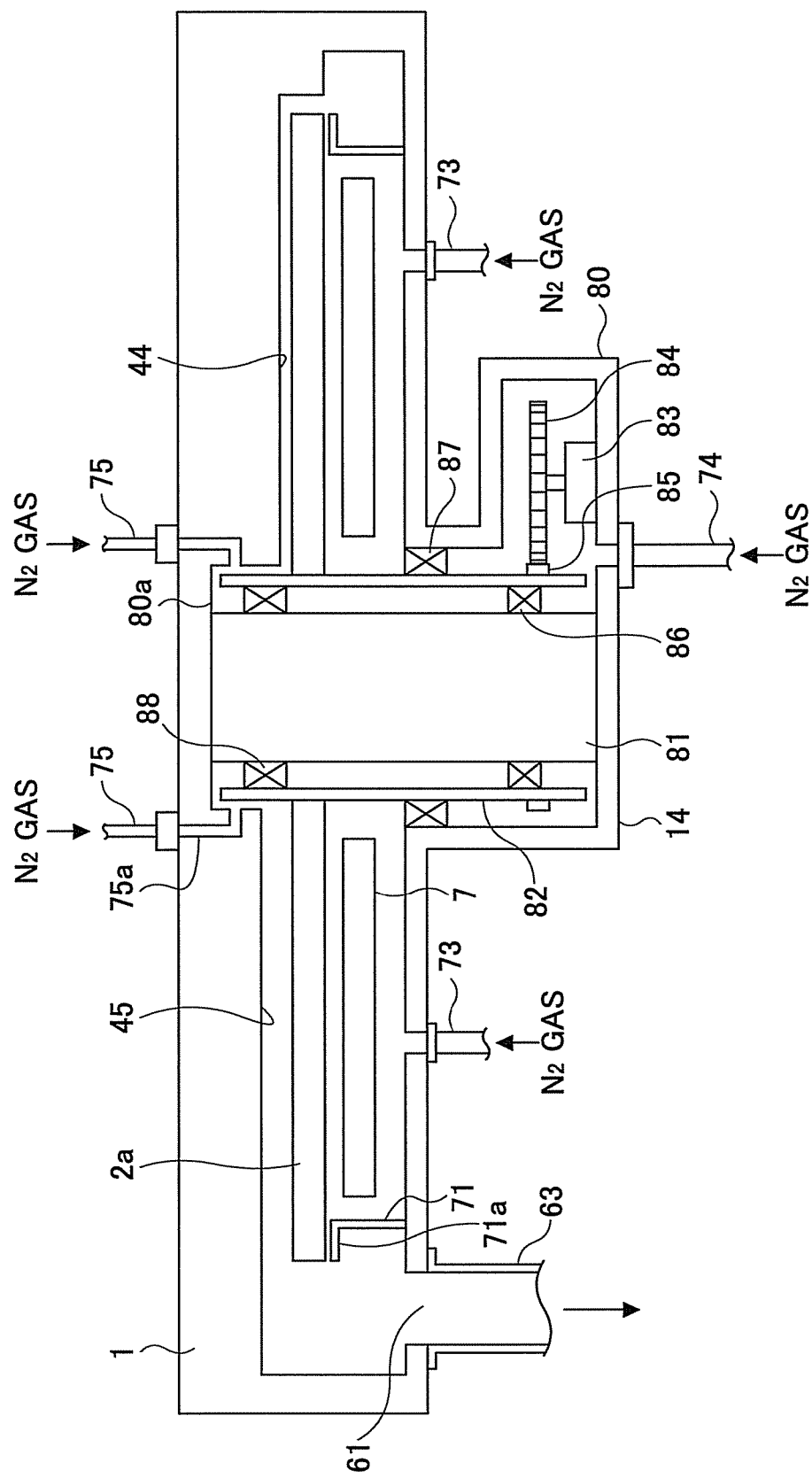
FIG. 20 is a cross-sectional view of the film deposition apparatus according to yet another variation of the first embodiment of the present invention.

In the film deposition apparatus of FIG. 20, the bottom part 14 projects downward to form a housing space 80 for a drive part in the center region of the vacuum chamber 1, and a recess 80a is formed at the upper end of the center region of the vacuum chamber 1. A pillar 81 is interposed between the bottom surface of the housing space 80 and the upper surface of the recess 80a in the center part of the vacuum chamber 1 so as to prevent BTBAS gas from the first reaction gas nozzle 31 and $O_3$ gas from the second reaction gas nozzle 32 from being mixed with each other through the center part of the vacuum chamber 1.

As for a mechanism for rotating the turntable 2, a rotation sleeve 82 is provided around the pillar 81, and an annular turntable 2a is provided along the rotation sleeve 82. The rotation sleeve 82 is supported by bearings 86 and 88 attached to the outside surface of the pillar 81 and bearings 87 attached to the inside surface of the housing space 80. A drive gear part 84 driven by a motor 83 is provided in the housing space 80, and the rotation sleeve 82 is caused to rotate by this drive mechanism via a gear part 85 provided at a lower part of the peripheral surface of the rotation sleeve 82. A purge gas feed pipe 74 is connected to the bottom part of the housing space 80. Purge gas feed pipes 75 for feeding a purge gas into a space between the side surface of the recess 80a and the upper end part of the rotation sleeve 82 through corresponding conduits 75a are connected to the upper part of the vacuum chamber 1. Referring to FIG. 20, two openings for feeding a purge gas into the space between the side surface of the recess 80a and the upper end part of the rotation sleeve 82 are formed in the recess 80a one on each lateral side. It is desirable to determine the number of such openings (purge gas feed openings) so as to prevent BTBAS gas and $O_3$ gas from being mixed with each other through a region near the rotation sleeve 82.

In the case illustrated in FIG. 19, viewing from the turntable 2 side, the space between the side surface of the recess 80a and the upper end part of the rotation sleeve 82 correspond to a separation gas ejection opening, and this separation gas ejection opening, the rotation sleeve 82, and the pillar 81 form the center region positioned in the center part of the vacuum chamber 1.

This embodiment is not limited to using two kinds of reaction gases, and may also be applied to the case of successively feeding three or more kinds of reaction gases onto a substrate. In this case, for example, a first reaction gas nozzle, a separation gas nozzle, a second reaction gas nozzle, a separation gas nozzle, and a third reaction gas nozzle, and a separation gas nozzle may be arranged in this order in a circumferential direction of the vacuum chamber 1, and separation regions including the respective separation gas nozzles may be configured as described above in this embodiment.

Figure 21:
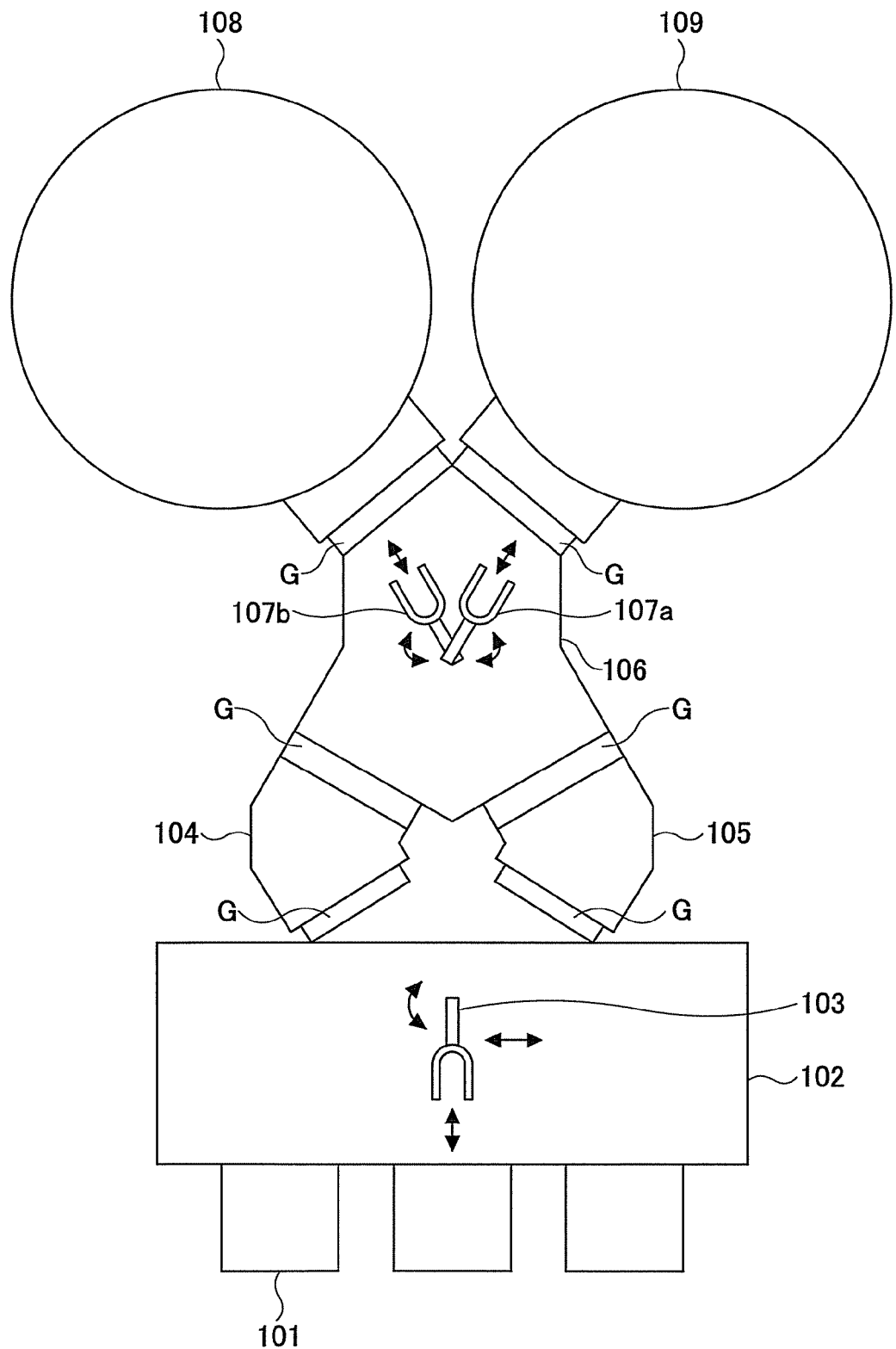
FIG. 21 is a schematic plan view illustrating a substrate processing system using the film deposition apparatuses according to the first embodiment of the present invention.

FIG. 21 illustrates a substrate processor using the above-described film deposition apparatus. Referring to FIG. 21, the substrate processor includes transfer enclosures 101 called FOUPs that contain, for example, 25 wafers each, an atmospheric transfer chamber 102 in which a transfer arm 103 is provided, load lock chambers 104 and 105 (auxiliary vacuum chambers) switchable between an ambient atmosphere and a vacuum atmosphere, a vacuum transfer chamber 106 in which two transfer arms 107a and 107b are provided, and film deposition apparatuses 108 and 109 according to this embodiment. In FIG. 21, G denotes gate valves.

Each transfer enclosure 101 is transferred from outside to a transfer in/out port with a placement table (not graphically illustrated) to be connected to the atmospheric transfer chamber 102, and thereafter has its lid opened by an opening/closing mechanism (not graphically illustrated) so as to have a wafer extracted from inside the transfer enclosure 101 by the transfer arm 103. Then, the wafer is transferred into the load lock chamber 104 or 105, which is then switched from the ambient atmosphere to the vacuum atmosphere. Thereafter, the wafer is extracted with the transfer arm 107a or 107b to be transferred into one of the film deposition apparatuses 108 and 109, where the above-described film deposition process is performed. It is possible to perform a so-called ALD (MLD) process with high throughput by thus having multiple film deposition apparatuses according to this embodiment.

Second Embodiment

Next, a description is given of a second embodiment of the present invention.

According to the second embodiment, the same film deposition apparatus as used in the first embodiment may be used, but multiple wafers, for example, five wafers are placed in the corresponding depressed parts 24 in the film deposition process.

Figure 22:
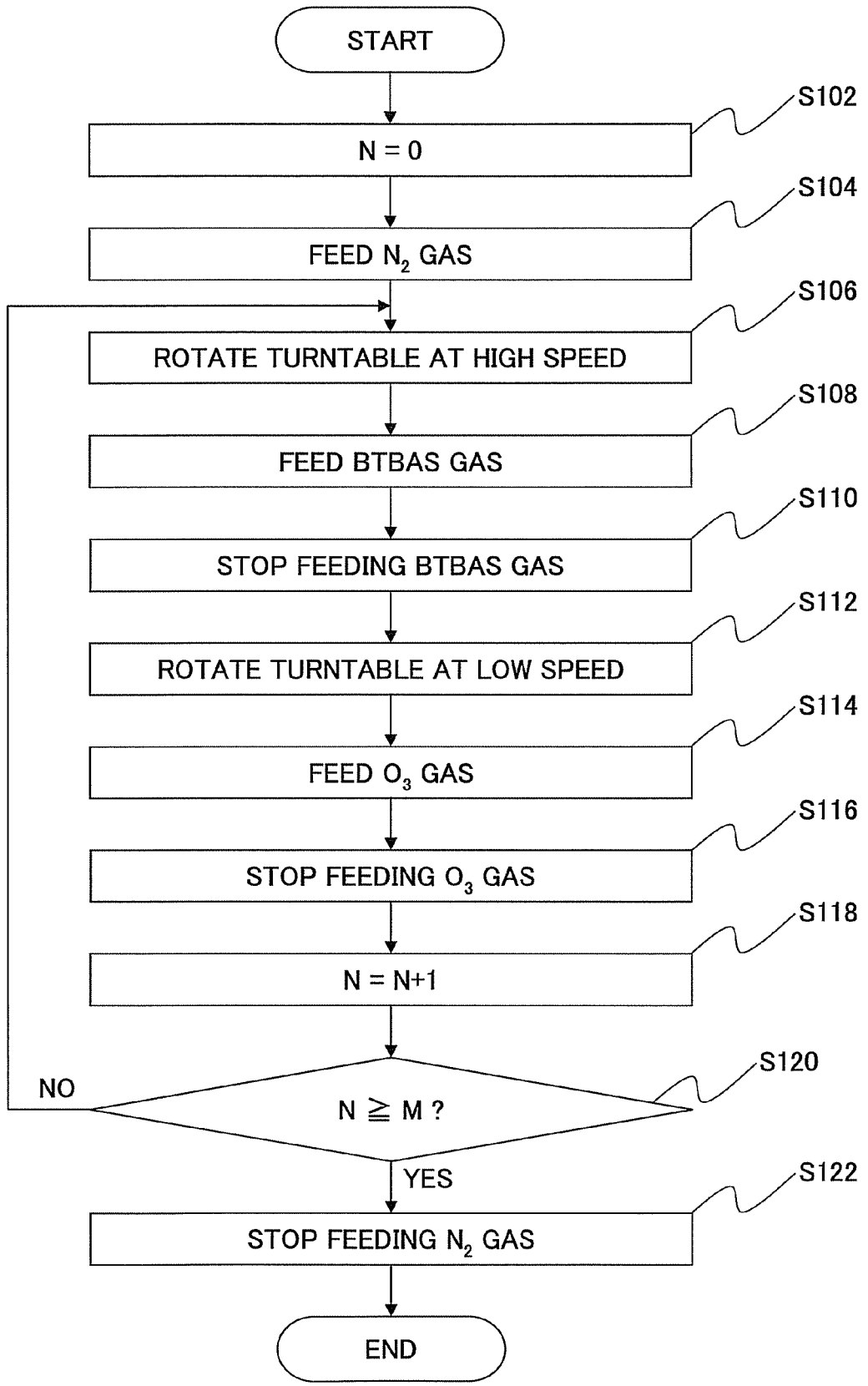
FIG. 22 is a flowchart illustrating a film deposition method according a second embodiment of the present invention.

A description is given below, with reference to the flowchart of FIG. 22, of a film deposition method according to this embodiment.

According to this embodiment, a film is deposited by feeding BTBAS gas and $O_3$ gas alternately from the first reaction gas nozzle 31 and the second reaction gas nozzle 32, respectively, while changing the rotational speed (rpm) of the turntable 2 with $N_2$ gas, which is a separation gas, being fed from the separation gas nozzles 41 and 42.

The same as in the first embodiment, film deposition is started after wafers W are heated and it is determined that the temperature of the wafers W has reached a setpoint with a temperature sensor (not graphically illustrated).

First, in step S102, the value of N of a register (not graphically illustrated) in the control part 100 (FIG. 1) is set to zero (0). The number of cycles M of feeding reaction gases per wafer W is input in advance. This number of cycles M, which is a value that depends on the thickness of a film deposited on each wafer W, is determined by a desired film thickness.

Next, in step S104, $N_2$ gas serving as a purge gas is fed from the purge gas feed pipes 72 and 73 (FIG. 1), $N_2$ gas serving as a separation gas is fed from the separation gas feed pipe 51 (FIG. 1), and $N_2$ gas serving as a separation gas is fed from the separation gas nozzles 41 and 42 (FIG. 2).

Next, in step S106, the turntable 2 is caused to rotate at high speed. For example, the turntable 2 is caused to rotate at 240 rpm.

Next, in step S108, BTBAS gas is fed from the first reaction gas nozzle 31 (FIG. 2). At this point, since $N_2$ gas, which is a separation gas, is fed from the separation gas nozzles 41 and 42, the BTBAS gas diffuses only in the first process region P1 (FIG. 2) and is prevented from diffusing to the second process region P2 (FIG. 2). Since no $O_3$ gas is fed from the second reaction gas nozzle 32 (FIG. 2), each wafer W placed on the turntable 2 is exposed to the BTBAS gas as a result of the rotation of the turntable 2. As a result, the BTBAS gas is adsorbed on the surface of each wafer W. Further, since this process of causing the BTBAS gas to be adsorbed on the surfaces of the wafers W is performed in a short period of time, the BTBAS gas is fed from the first reaction gas nozzle 31 while the turntable 2 is rotating at high speed.

Next, in step S110, the feeding of the BTBAS gas from the first reaction gas nozzle 31 is stopped.

Next, in step S112, the turntable 2 is caused to rotate at low speed. For example, the turntable 2 is caused to rotate at 120 rpm.

Next, in step S114, $O_3$ gas is fed from the second reaction gas nozzle 32. At this point, since $N_2$ gas, which is a separation gas, is fed from the separation gas nozzles 41 and 42, the $O_3$ gas diffuses only in the first process region P1 and is prevented from diffusing to the second process region P2. Since no BTBAS gas is fed from the first reaction gas nozzle 31, each wafer W placed on the turntable 2 is exposed to the $O_3$ gas as a result of the rotation of the turntable 2. As a result, the $O_3$ gas fed from the second reaction gas nozzle 32 reacts with the BTBAS gas adsorbed on the surfaces of the wafers W, so that a silicon oxide molecular layer is formed on the surface of each wafer W. This process, in which the BTBAS gas and the $O_3$ gas react with each other, takes time. Accordingly, the turntable 2 is caused to rotate at a speed lower than in the process of step S108.

Next, in step S116, the feeding of the $O_3$ gas from the second reaction gas nozzle 32 is stopped.

Next, in step S118, the value of N of the register in the control part 100 is incremented by one.

Next, in step S120, the value of N of the register and the value of M are compared, thereby determining whether N≥M. If the value of N is less than the value of M (NO in step S120), the process returns to step S106. On the other hand, if the value of N is greater than or equal to the value of M, the process proceeds to step S122.

Next, in step S122, the feeding of $N_2$ gas serving as a purge gas from the purge gas feed pipes 72 and 73, the feeding of $N_2$ gas as a separation gas from the separation gas feed pipe 51, and the feeding of $N_2$ gas as a separation gas from the separation gas nozzles 41 and 42 are stopped.

By this process, the film deposition according to this embodiment ends.

According to this embodiment, a time for a process by the BTBAS gas fed by a first reaction gas feed part and a time for a process by the $O_3$ gas fed by a second reaction gas feed part may be controlled by controlling the rotational speed (rpm) of the turntable 2, so that a compact, high-quality film may be deposited simultaneously on the surfaces of multiple wafers W in a short period of time.

Further, a first process region where the BTBAS gas is fed by the first reaction gas feed part and a second process region where the $O_3$ gas is fed by the second reaction gas feed part are separated by separation regions D. Therefore, even if one of the BTBAS gas and the $O_3$ gas fed alternately remains after the stoppage of its feeding, the remaining one is prevented from reacting with the other one newly fed, so that it is possible to prevent occurrence of contamination. Further, $N_2$ gas is fed constantly as a separation gas. Therefore, when the feeding of BTBAS gas or $O_3$ gas is stopped, the gas remaining in the first or second process gas region can be purged immediately. Accordingly, it is possible to improve throughput in alternate feeding of gases.

This embodiment is not limited to using two kinds of reaction gases, and may also be applied to the case of successively feeding three or more kinds of reaction gases onto a substrate. In this case, for example, a first reaction gas nozzle, a separation gas nozzle, a second reaction gas nozzle, a separation gas nozzle, and a third reaction gas nozzle, and a separation gas nozzle may be arranged in this order in a circumferential direction of the vacuum chamber 1, and the separation regions including respective separation gas nozzles may be configured as described above in the first embodiment.

According to this embodiment, the same substrate processor as described above with reference to FIG. 21 in the first embodiment may be used. As a result, it is possible to perform a so-called ALD (MLD) process with high throughput in this embodiment as well.

The present invention is not limited to the specifically disclosed embodiments, and variations and modifications may be made without departing from the scope of the present invention.

What is claimed is:

1. A film deposition apparatus for depositing a thin film on a substrate by stacking reaction products in layers by carrying out a cycle of successively feeding at least two kinds of reaction gases reacting with each other onto a surface of the substrate in a vacuum chamber, the film deposition apparatus comprising:
   a turntable provided in the vacuum chamber;
   a substrate placement part provided on a substrate-receiving surface of the turntable and configured to receive the substrate;
   a first reaction gas feed part and a second reaction gas feed part provided apart from each other in a rotation direction of the turntable and configured to feed a first reaction gas and a second reaction gas into a first process region and a second process region, respectively, on a side of the substrate-receiving surface of the turntable;
   a separation region positioned between the first process region and the second process region in the rotation direction of the turntable and configured to separate atmospheres of the first and second process regions, the separation region including a first separation gas feed part configured to feed a first separation gas thereinto so that the first separation gas flows toward the first and second process regions in the separation region, and a ceiling surface provided on each of sides of the first separation gas feed part in the rotation direction of the turntable in the separation region, wherein the ceiling surface has a width in the rotation direction of the turntable increasing toward a periphery of the ceiling surface, and wherein the separation region has a vertical height that is smaller, relative to the turntable, than respective vertical heights of the first and second process region;
   a center part region positioned at a center part inside the vacuum chamber and configured to separate the atmospheres of the first and second process regions, the center part region including an ejection opening for ejecting a second separation gas toward the substrate-receiving surface of the turntable;
   an evacuation port configured to evacuate the first separation gas diffused to each side of the separation region, the second separation gas ejected from the center part region, and the first and second reaction gases; and
   a drive part configured to rotate the turntable so that the substrate passes through the first and second process regions at different angular velocities of the turntable.

2. The film deposition apparatus as claimed in claim 1, further comprising:
   a second separation gas feed part configured to feed the second separation gas from the center part region,
   wherein the ceiling surface is opposed to the substrate-receiving surface of the turntable, and
   the evacuation port is provided at a position lower than the turntable so as to evacuate the first separation gas diffused to each side of the separation region, the second separation gas ejected from the center part region, and the first and second reaction gases through a gap between a periphery of the turntable and an inner wall surface of the vacuum chamber.

3. The film deposition apparatus as claimed in claim 1, wherein the substrate placement part includes a depressed part formed on the substrate-receiving surface of the turntable so that a surface of the substrate received in the depressed part is level with or lower than the substrate-receiving surface of the turntable.

4. The film deposition apparatus as claimed in claim 1, wherein a transfer port configured to be opened and closed by a gate valve is provided in a sidewall of the vacuum chamber so as to allow the substrate to be transferred from outside to inside the vacuum chamber through the transfer port.

5. The film deposition apparatus as claimed in claim 1, further comprising:
   a heating part configured to heat the turntable.

6. The film deposition apparatus as claimed in claim 5, wherein the heating part is provided below the turntable.

7. The film deposition apparatus as claimed in claim 5, wherein the heating part is provided above the turntable.

8. A substrate processor, comprising:
   a vacuum transfer chamber having a substrate transfer part provided therein;
   the film deposition apparatus as set forth in claim 1, the film deposition apparatus being connected hermetically to the vacuum transfer chamber; and
   an auxiliary vacuum chamber connected hermetically to the vacuum transfer chamber, the auxiliary vacuum chamber being switchable between a vacuum atmosphere and an ambient atmosphere.

9. A film deposition apparatus for depositing a thin film on a substrate by stacking reaction products in layers by carrying out a cycle of successively feeding at least two kinds of reaction gases reacting with each other onto a surface of the substrate in a vacuum chamber, the film deposition apparatus comprising:
   a turntable provided in the vacuum chamber;
   a substrate placement part provided on a substrate-receiving surface of the turntable and configured to receive the substrate;
   a first reaction gas feed part and a second reaction gas feed part provided apart from each other in a rotation direction of the turntable and configured to feed a first reaction gas and a second reaction gas into a first process region and a second process region, respectively, on a side of the substrate-receiving surface of the turntable;
   a separation region positioned between the first process region and the second process region in the rotation direction of the turntable and configured to separate atmospheres of the first and second process regions, the separation region including a first separation gas feed part configured to feed a first separation gas thereinto so that the first separation gas flows toward the first and second process regions in the separation region, and a ceiling surface provided on each of sides of the first separation gas feed part in the rotation direction of the turntable in the separation region, wherein the ceiling surface has a width in the rotation direction of the turntable increasing toward a periphery of the ceiling surface, and wherein the separation region has a vertical height that is smaller, relative to the turntable, than respective vertical heights of the first and second process region;
a center part region positioned at a center part inside the vacuum chamber and configured to separate the atmospheres of the first and second process regions, the center part region including an ejection opening for ejecting a second separation gas toward the substrate-receiving surface of the turntable;
an evacuation port configured to evacuate the first separation gas diffused to each side of the separation region, the second separation gas ejected from the center part region, and the first and second reaction gases;
a drive part configured to rotate the turntable; and
a control part configured to control the first and second reaction gas feed parts and the drive part so as to stop feeding the second reaction gas in the second reaction gas feed part at a time of feeding the first reaction gas through the first reaction gas feed part, stop feeding the first reaction gas in the first reaction gas feed part at a time of feeding the second reaction gas through the second reaction gas feed part, and rotate the turntable at different angular velocities at the time of feeding the first reaction gas through the first reaction gas feed part and at the time of feeding the second reaction gas through the second reaction gas feed part.

* * * * *